United States Patent [19]
Kimura

[11] Patent Number: 5,349,206
[45] Date of Patent: * Sep. 20, 1994

[54] INTEGRATED MEMORY CIRCUIT WITH HIGH DENSITY LOAD ELEMENTS

[75] Inventor: Masakazu Kimura, Suwa, Japan

[73] Assignee: Seiko Epson Corporation, Tokyo, Japan

[*] Notice: The portion of the term of this patent subsequent to Apr. 21, 2009 has been disclaimed.

[21] Appl. No.: 871,871

[22] Filed: Apr. 20, 1992

Related U.S. Application Data

[63] Continuation-in-part of Ser. No. 410,936, Sep. 22, 1989, Pat. No. 5,107,322.

[30] Foreign Application Priority Data

Nov. 10, 1988 [JP] Japan .................... 63-284686

[51] Int. Cl.$^5$ ............................ H01L 27/01
[52] U.S. Cl. ...................... 257/67; 257/69; 257/393; 257/903; 257/904
[58] Field of Search ............ 257/903, 904, 393, 369, 257/385, 67, 69

[56] References Cited

U.S. PATENT DOCUMENTS

| | | | |
|---|---|---|---|
| 4,805,147 | 2/1989 | Yamanaka et al. | 257/904 |
| 4,853,894 | 8/1989 | Yamanaka et al. | 257/903 |
| 5,057,898 | 10/1991 | Adan et al. | 257/903 |
| 5,107,322 | 4/1992 | Kimura | 257/904 |
| 5,157,474 | 10/1992 | Ochii | 257/904 |

FOREIGN PATENT DOCUMENTS 61-283161 12/1986 Japan .................... 257/904

*Primary Examiner*—Jerome Jackson
*Assistant Examiner*—Courtney A. Bowers
*Attorney, Agent, or Firm*—W. Douglas Carothers, Jr.

[57] ABSTRACT

An integrated circuit with high density load elements in memory cells forming a memory array wherein the load elements are either of the active (e.g., TFTs) or passive (e.g., resistance) type and designed so that the connection path between these elements and active element domains is extended to be longer within the same or smaller scale of the memory cell configuration. For this purpose, the connection path may be made to meander to provide for greater length, i.e., extend in one direction and then another within a single memory cell configuration. This further creates additional space for extending the resistance value of the active or passive load element which, in turn, permits a reduction in drain current, i.e., current consumption, during operational conditions of the memory cells or other circuits. The design further provides for improved mask alignment accuracy since the load element is completely constructed within a planar extent of the memory cell so that predetermined lengths of the element and predetermined, desired resistance levels can be achieved and maintained without concern for resistance level changes due to subsequent integrated circuit processing and contaminate migration.

23 Claims, 15 Drawing Sheets

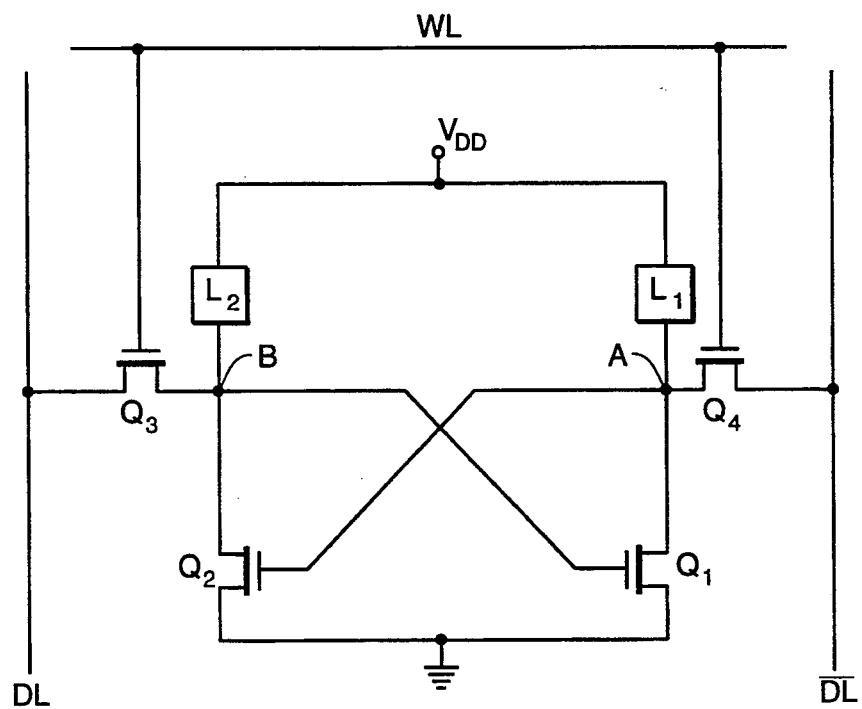
FIG._1
*(PRIOR ART)*
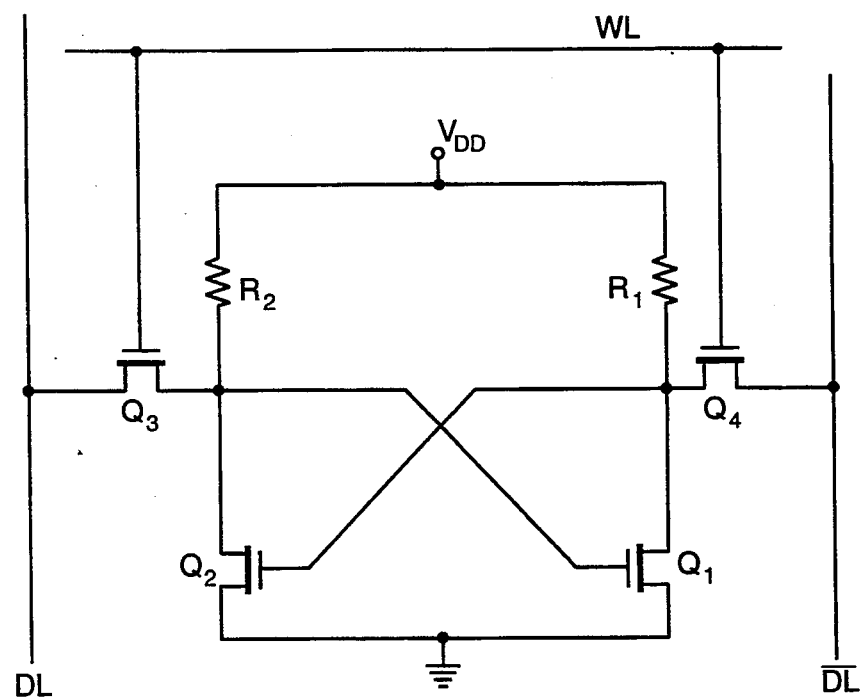
FIG._3
*(PRIOR ART)*

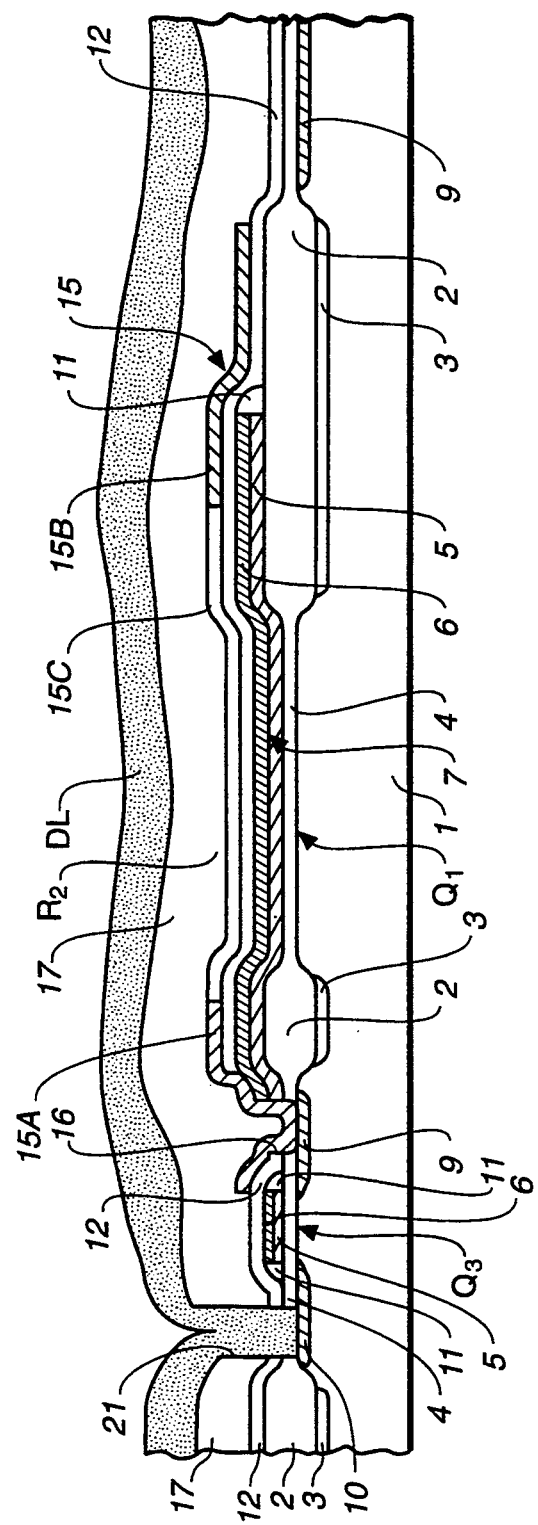
FIG._2 (PRIOR ART)

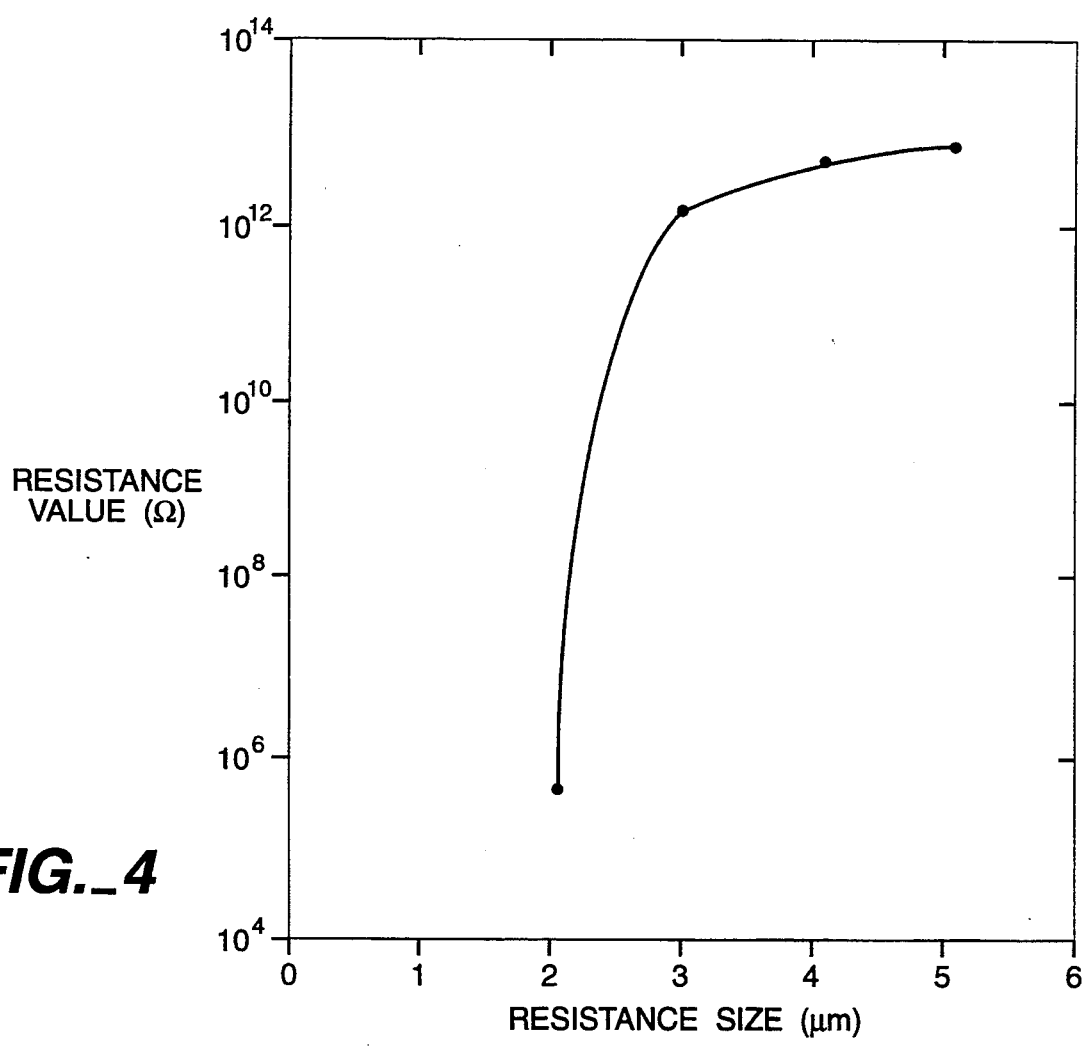
FIG._4
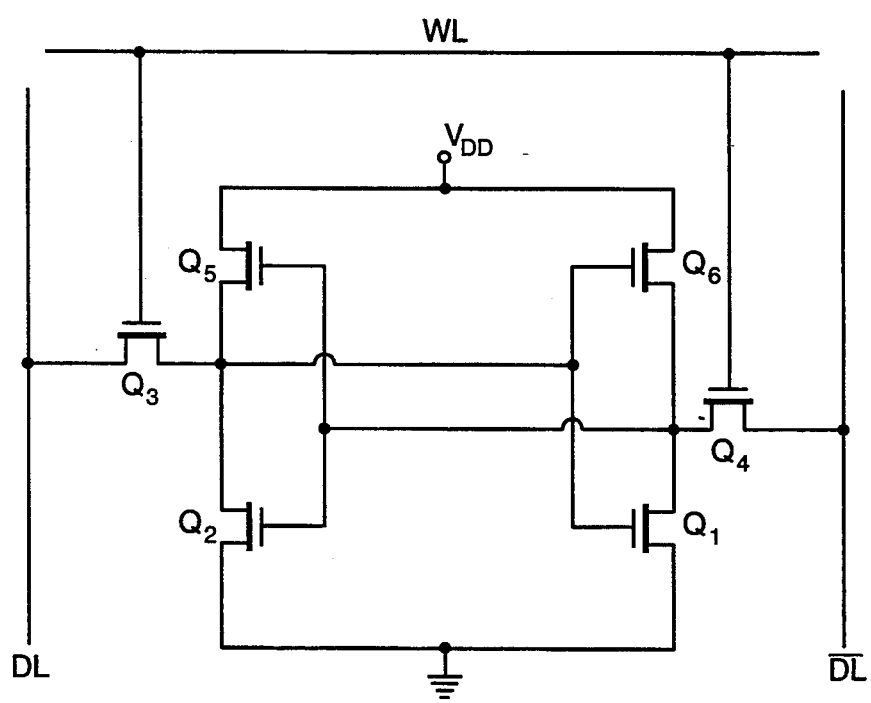
FIG._5
(PRIOR ART)

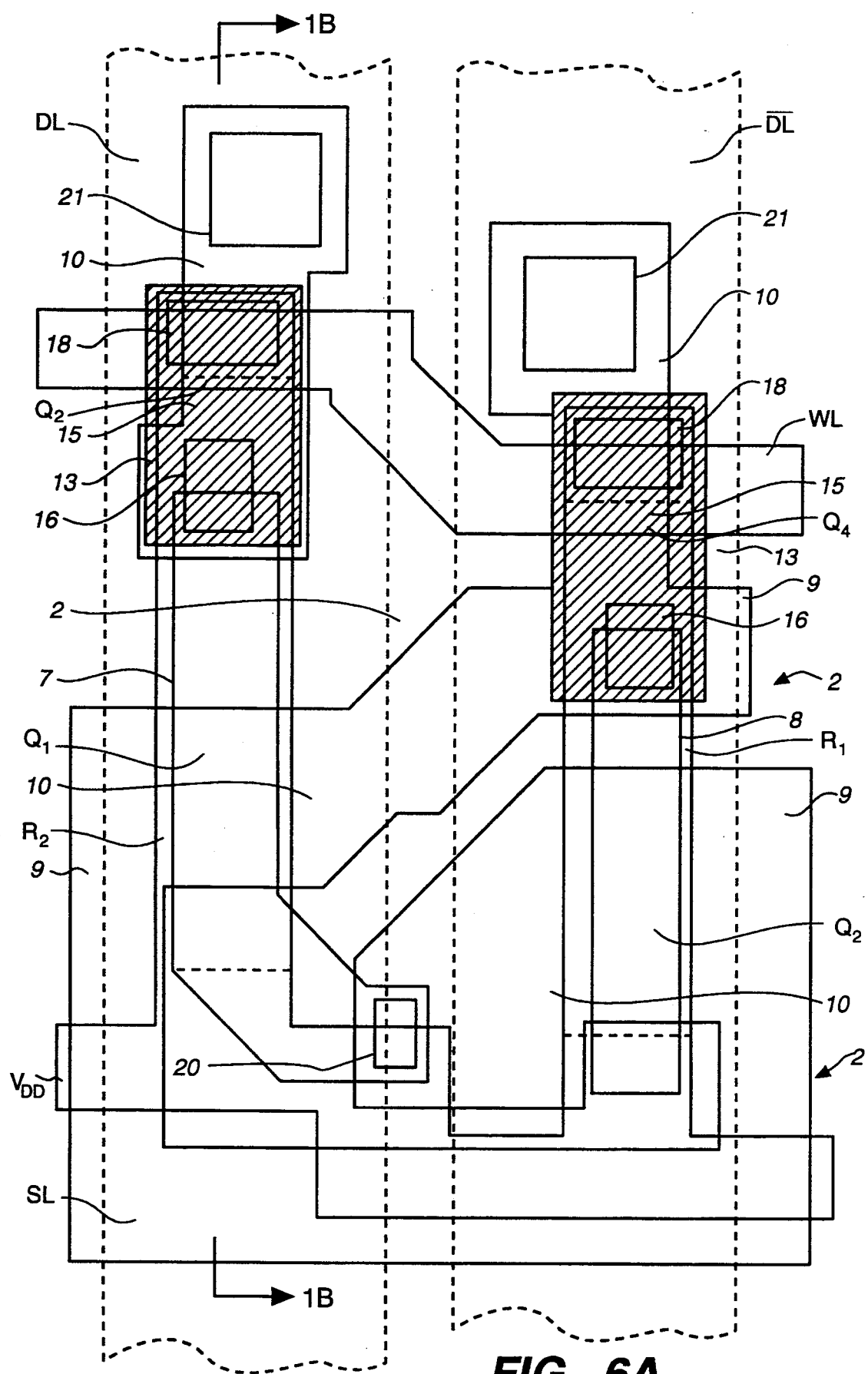
FIG._6A

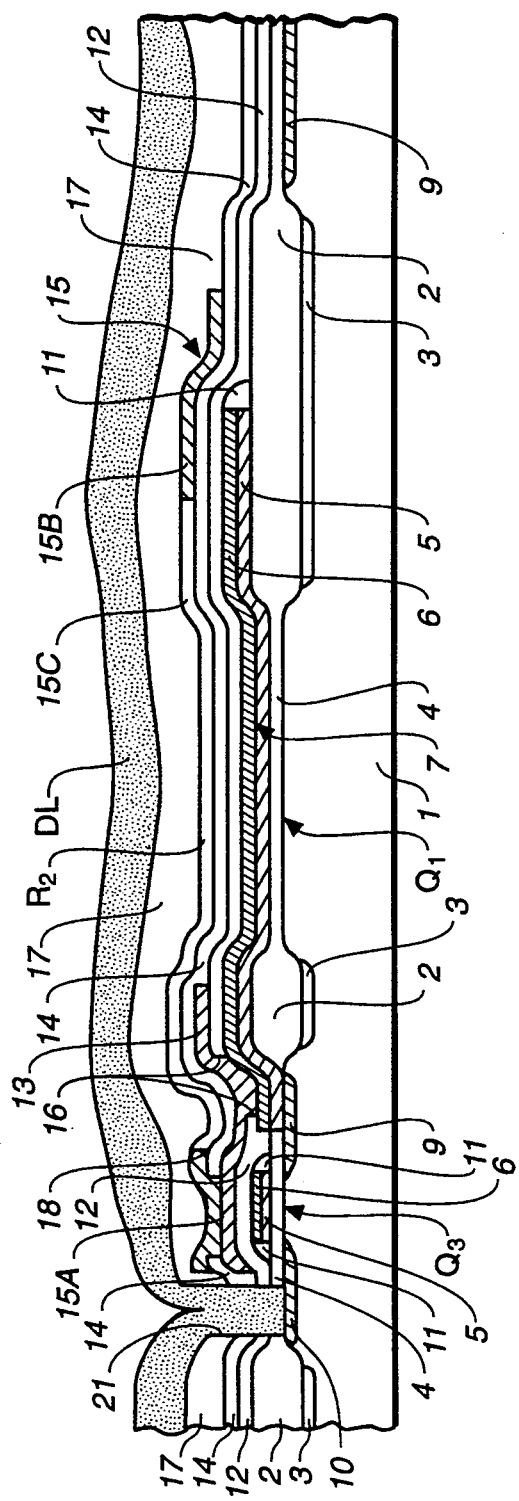
FIG._6B
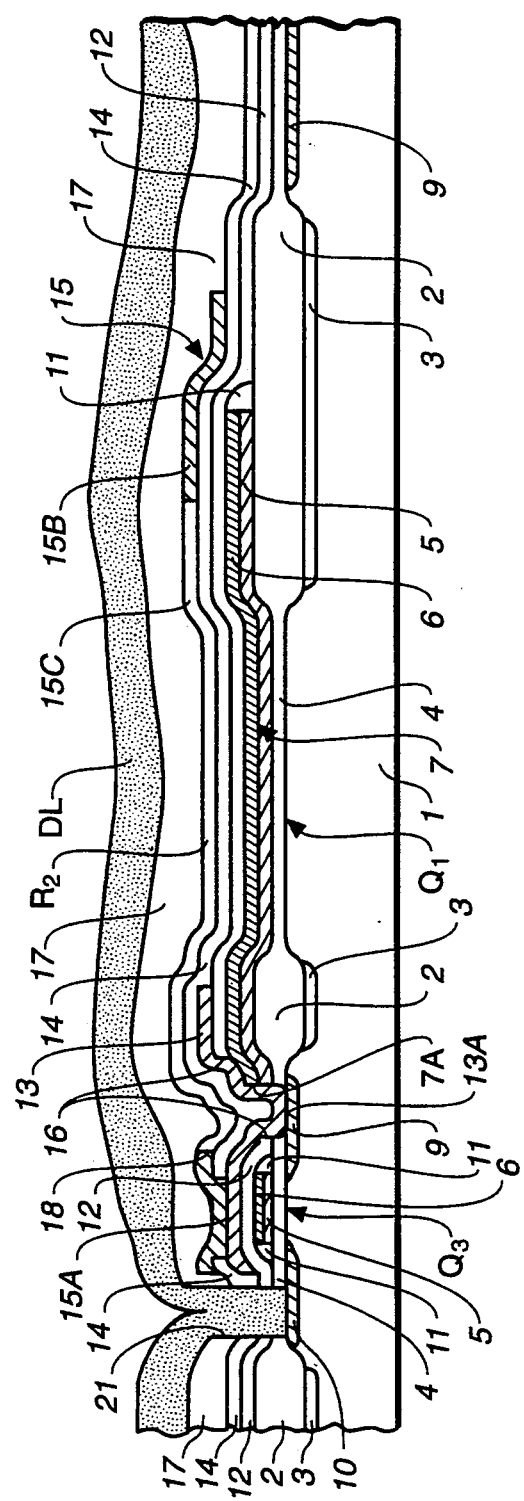
FIG._6C

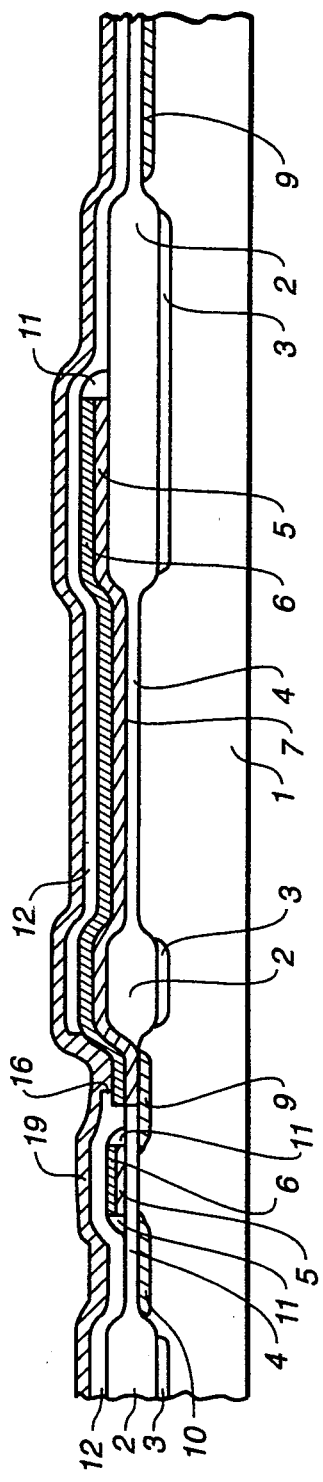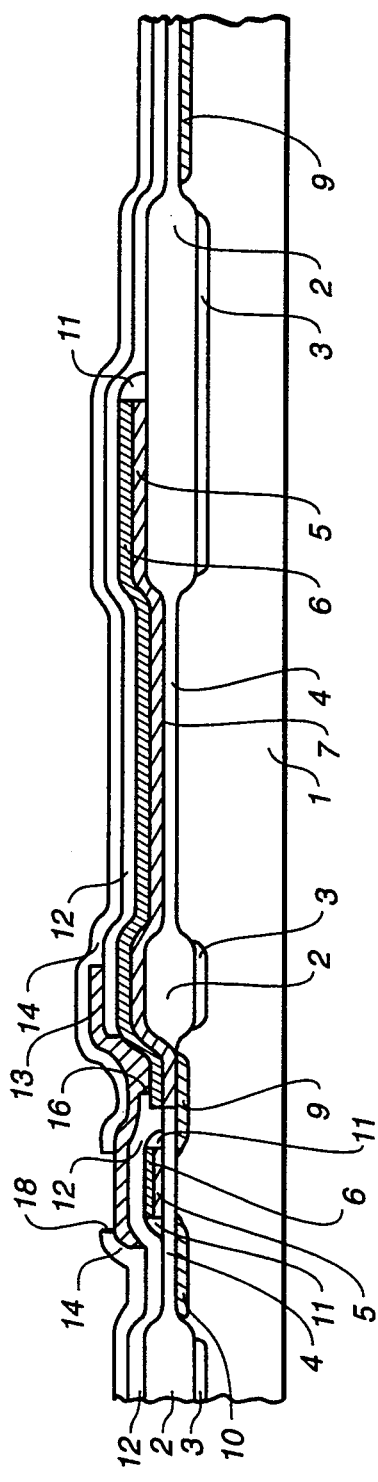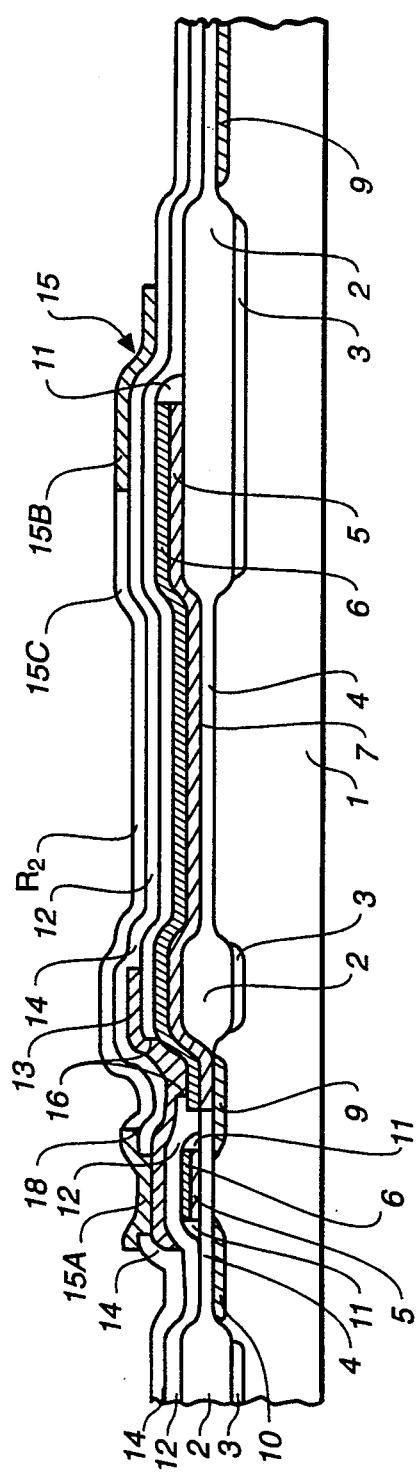
FIG._7A  FIG._7B  FIG._7C

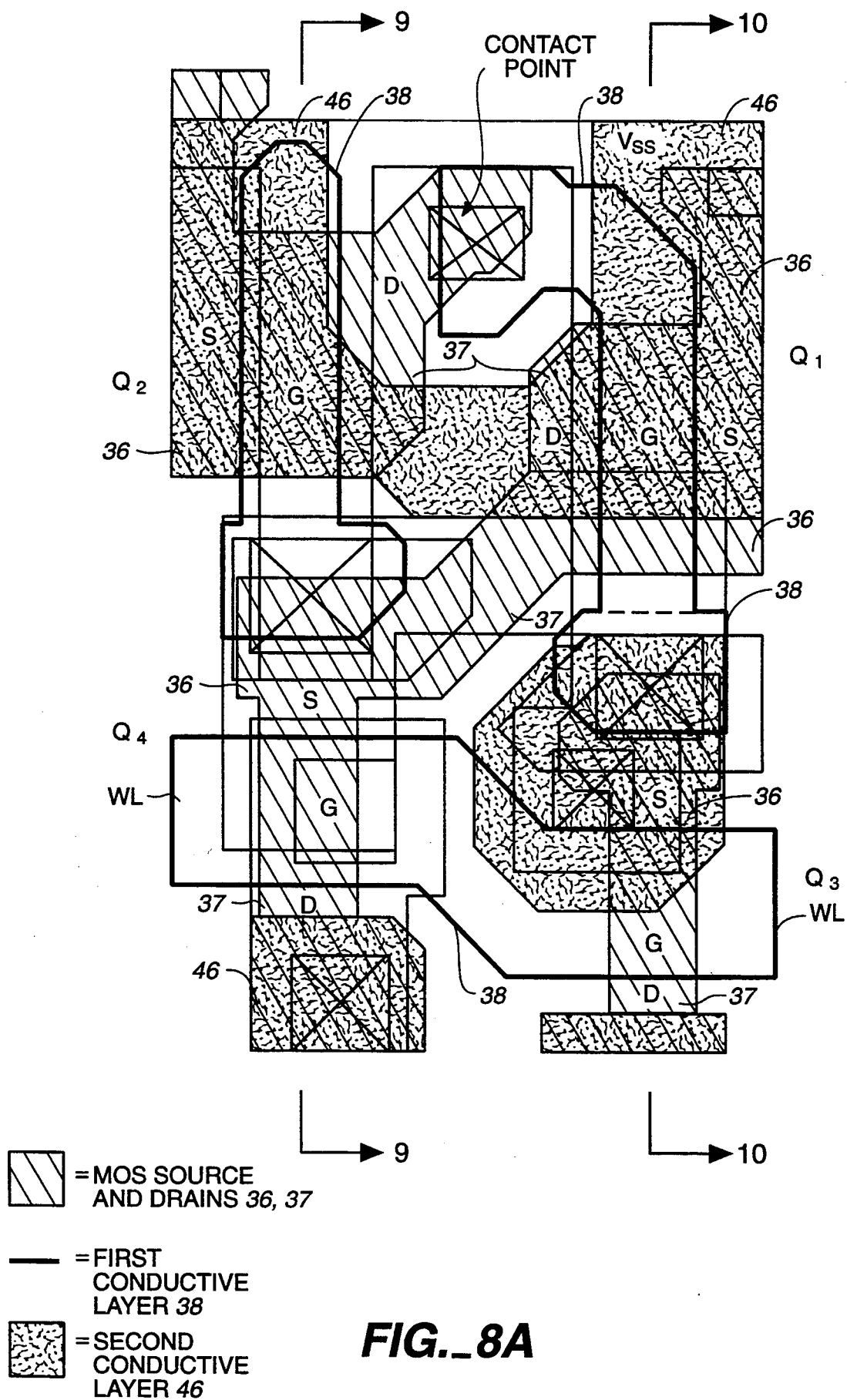
FIG._8A

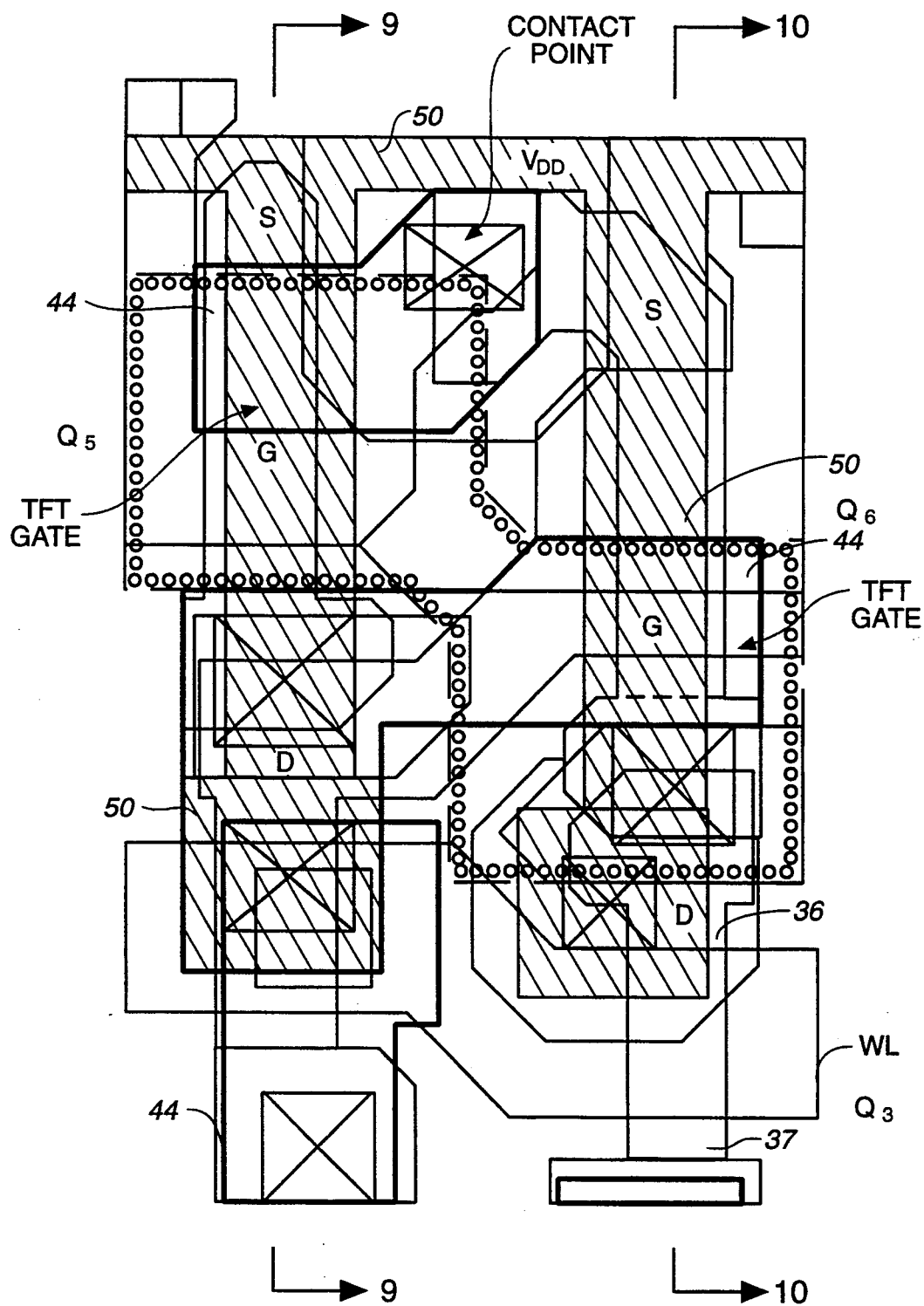
FIG._8B

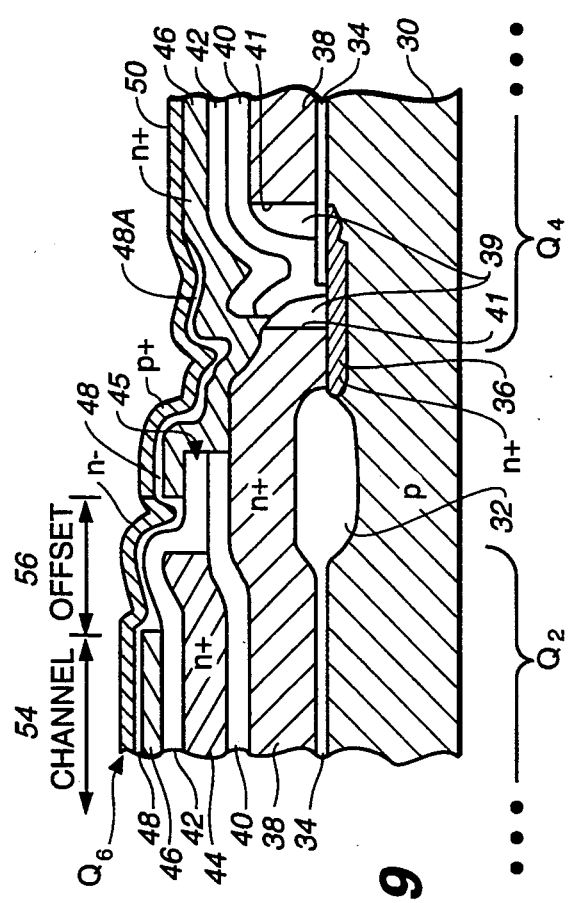
FIG._9
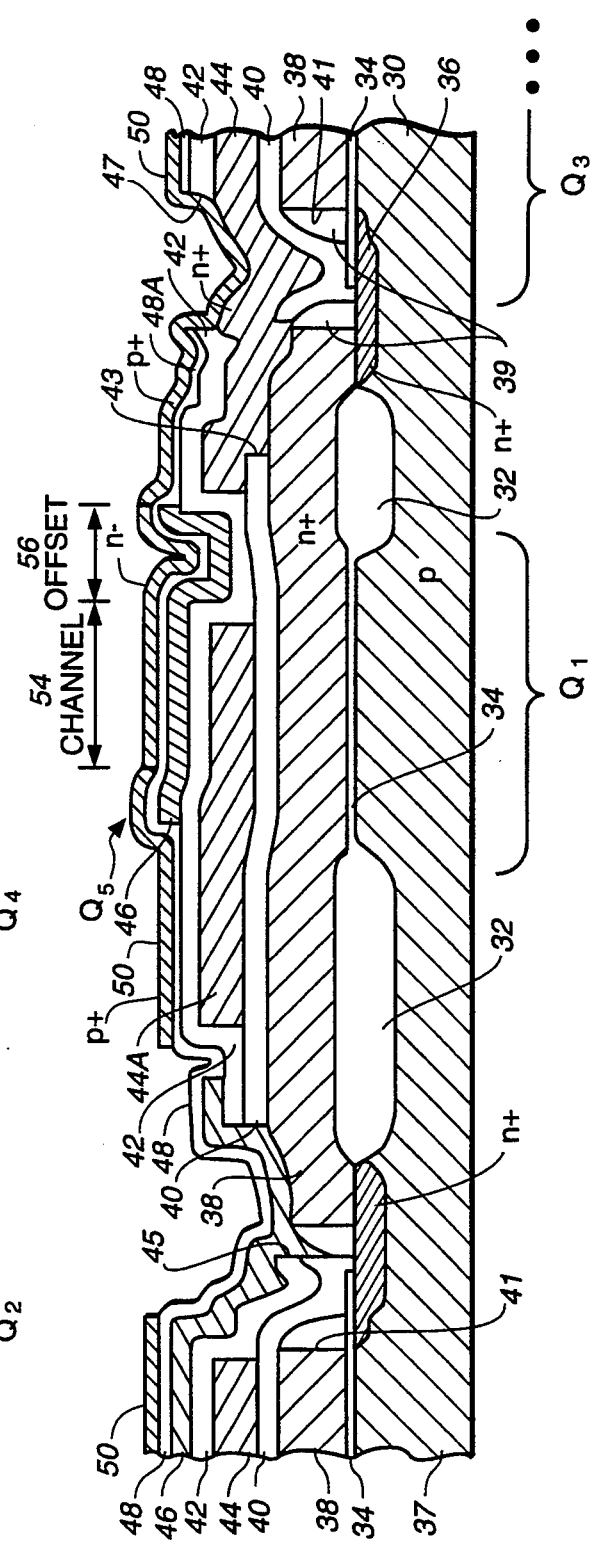
FIG._10

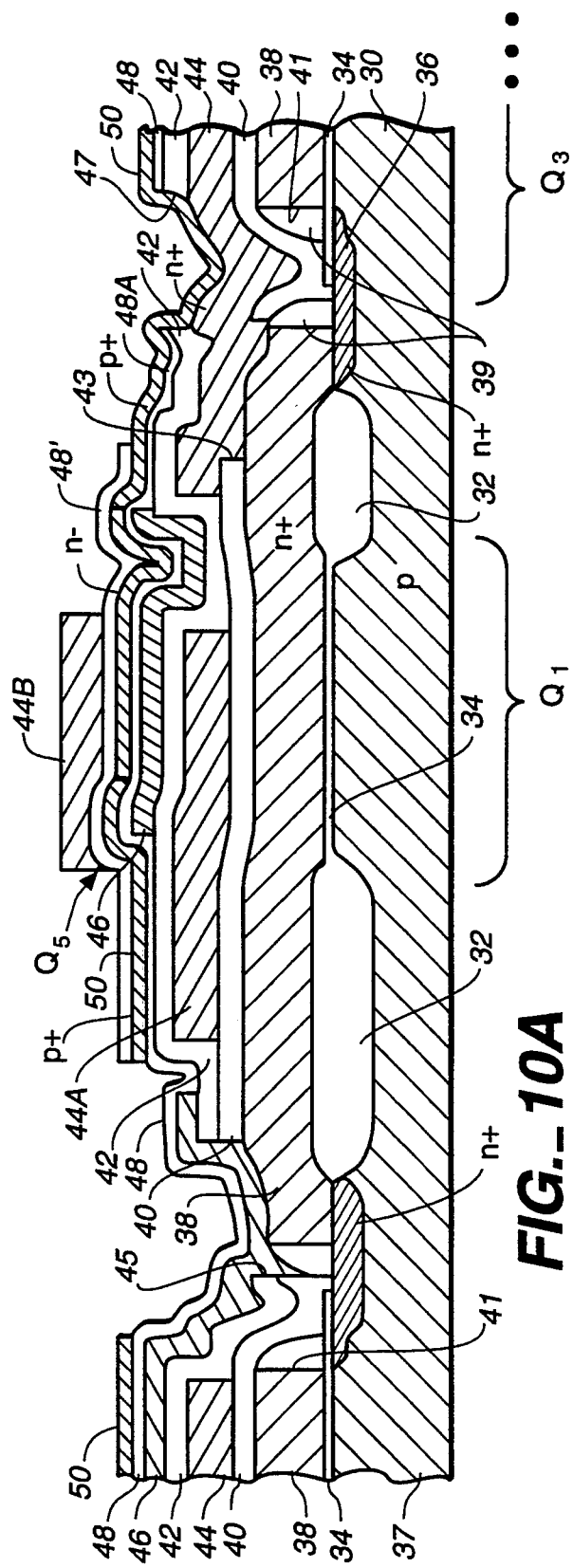
FIG._10A

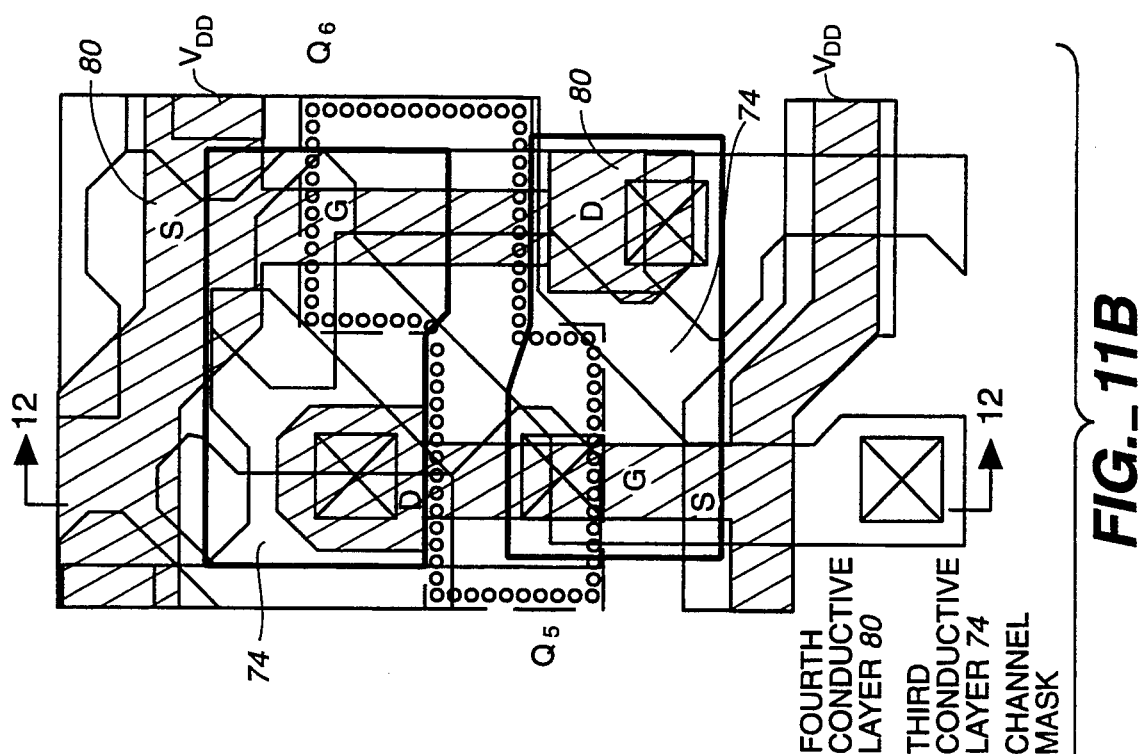
FIG._11B
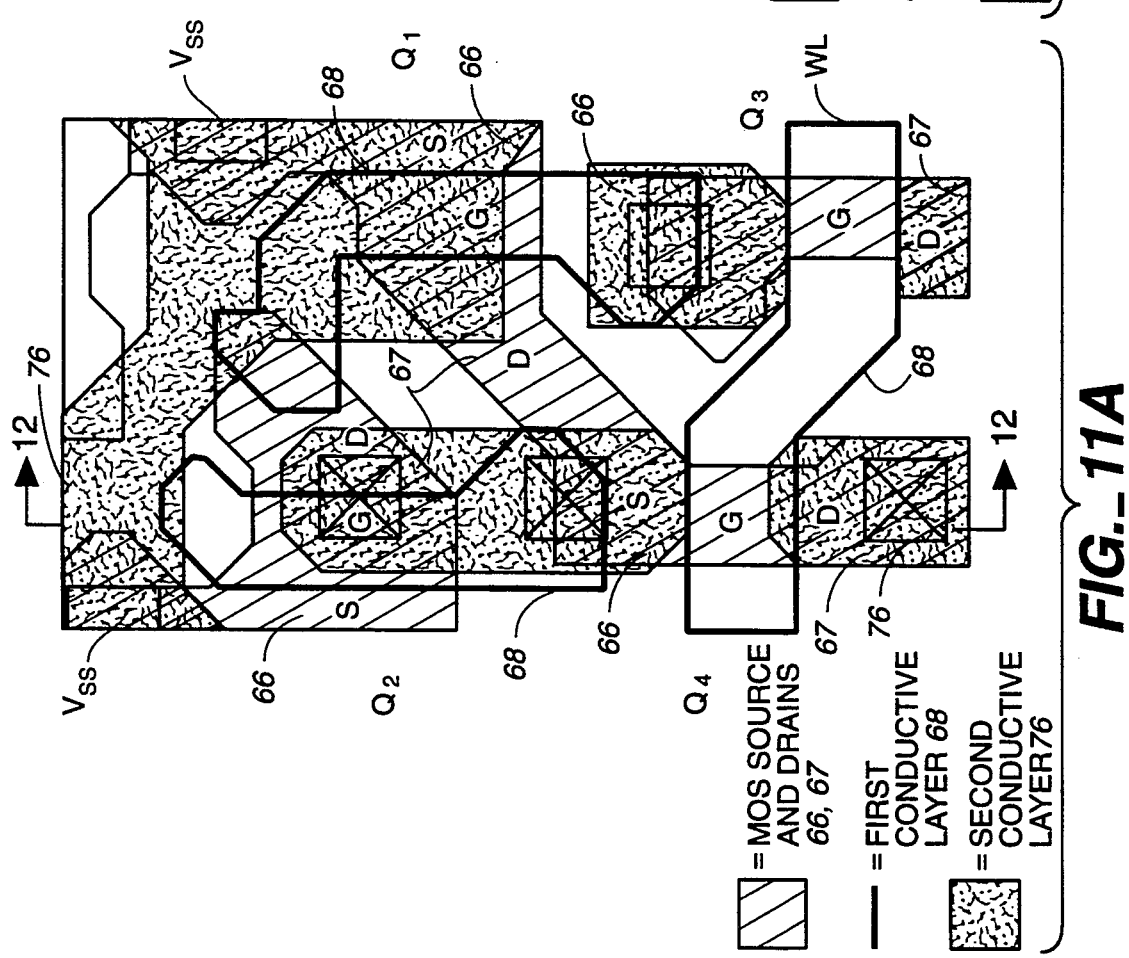
FIG._11A

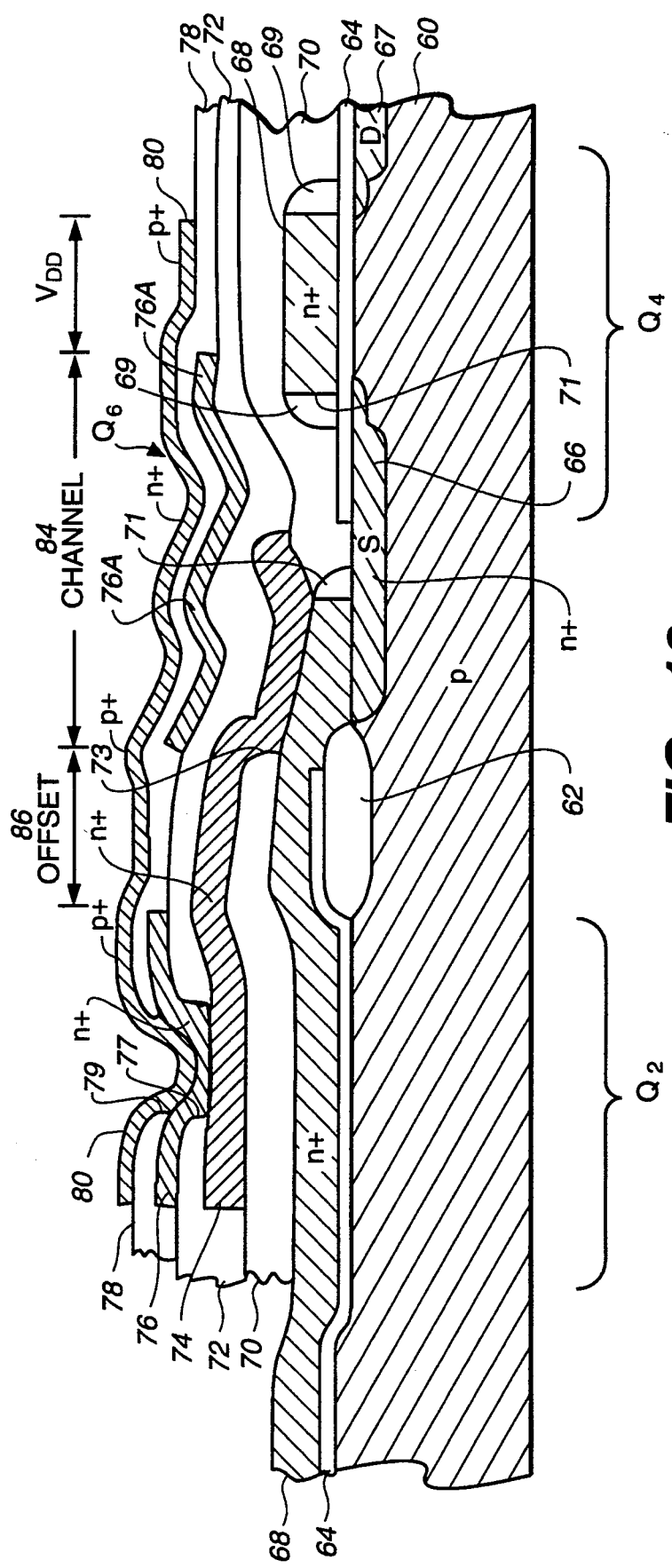
FIG.—12

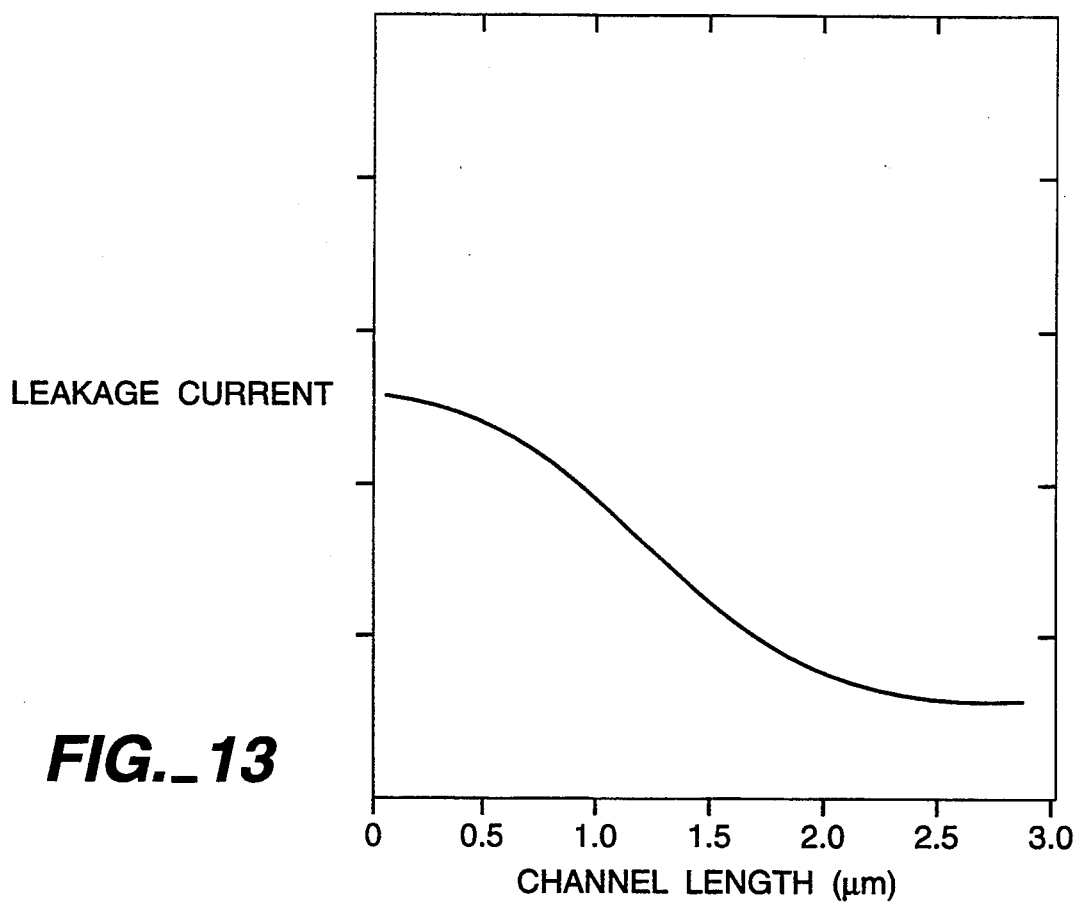
FIG._13
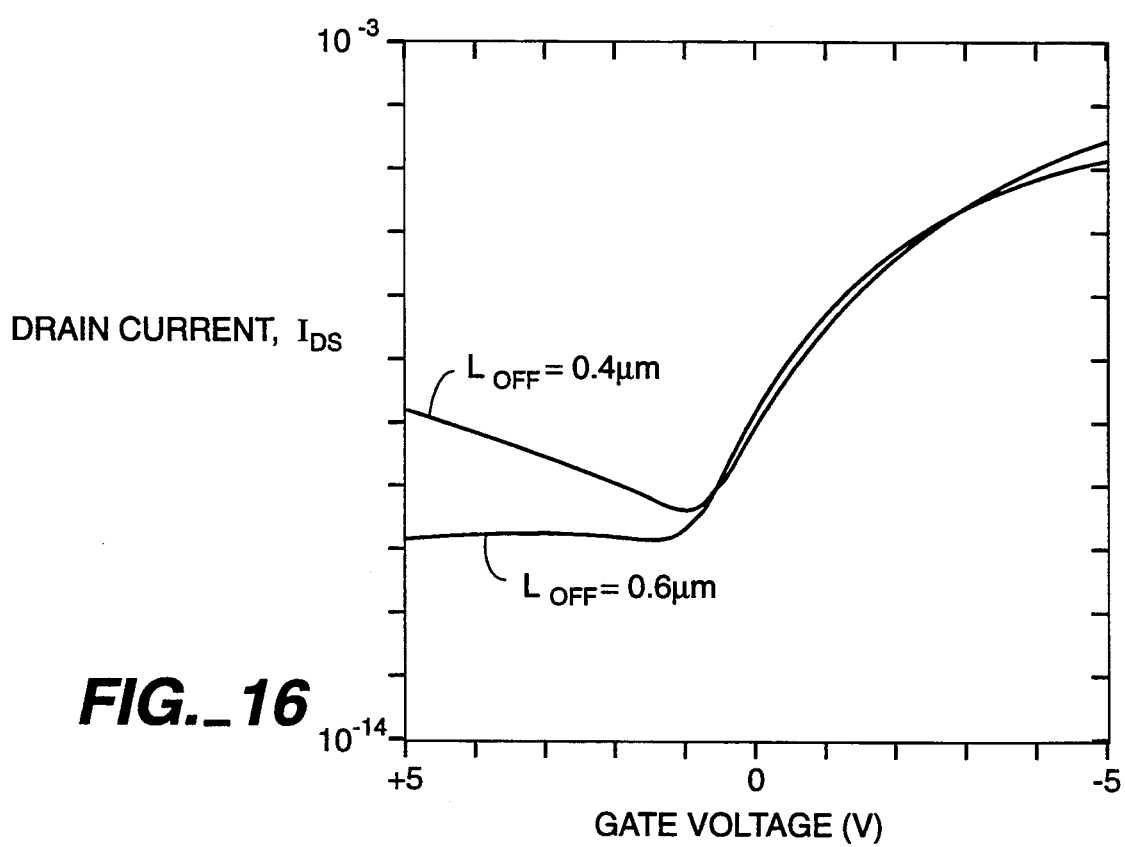
FIG._16

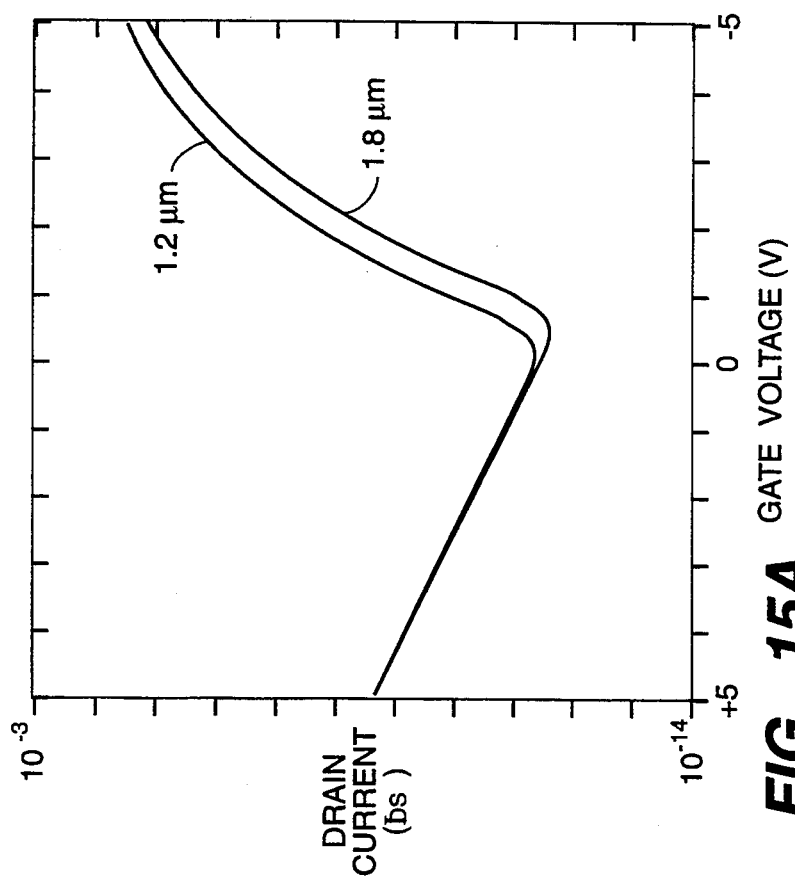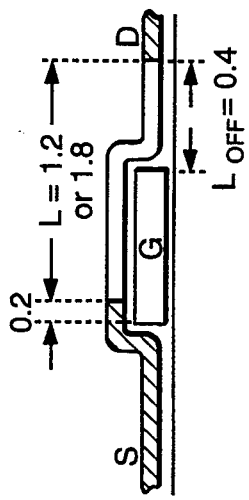
FIG._14A
FIG._14B
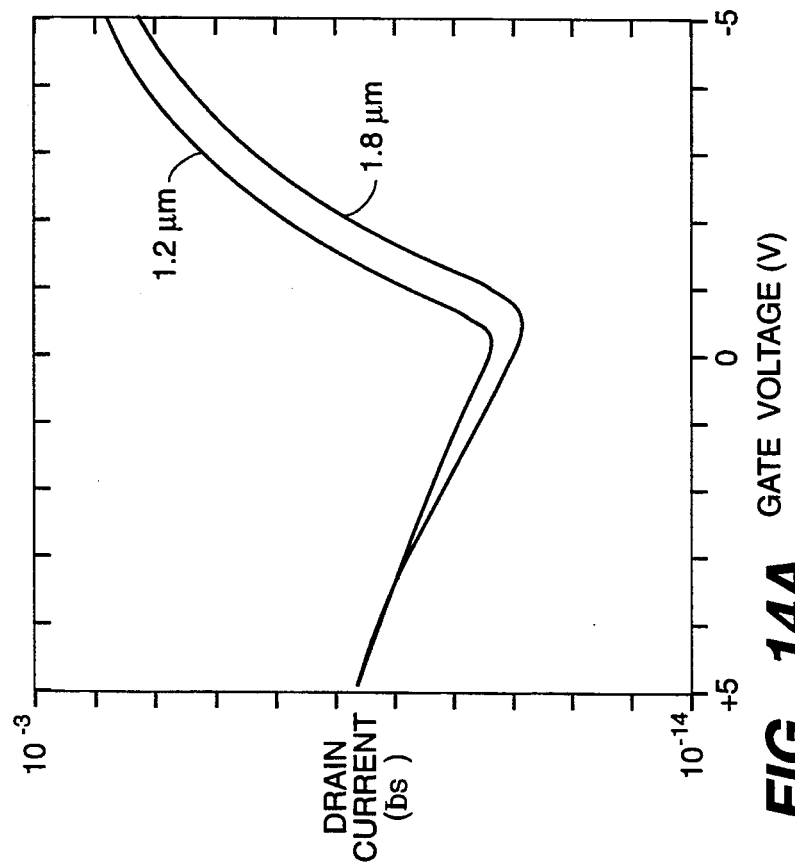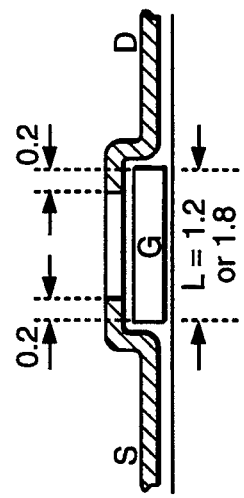
FIG._15A
FIG._15B

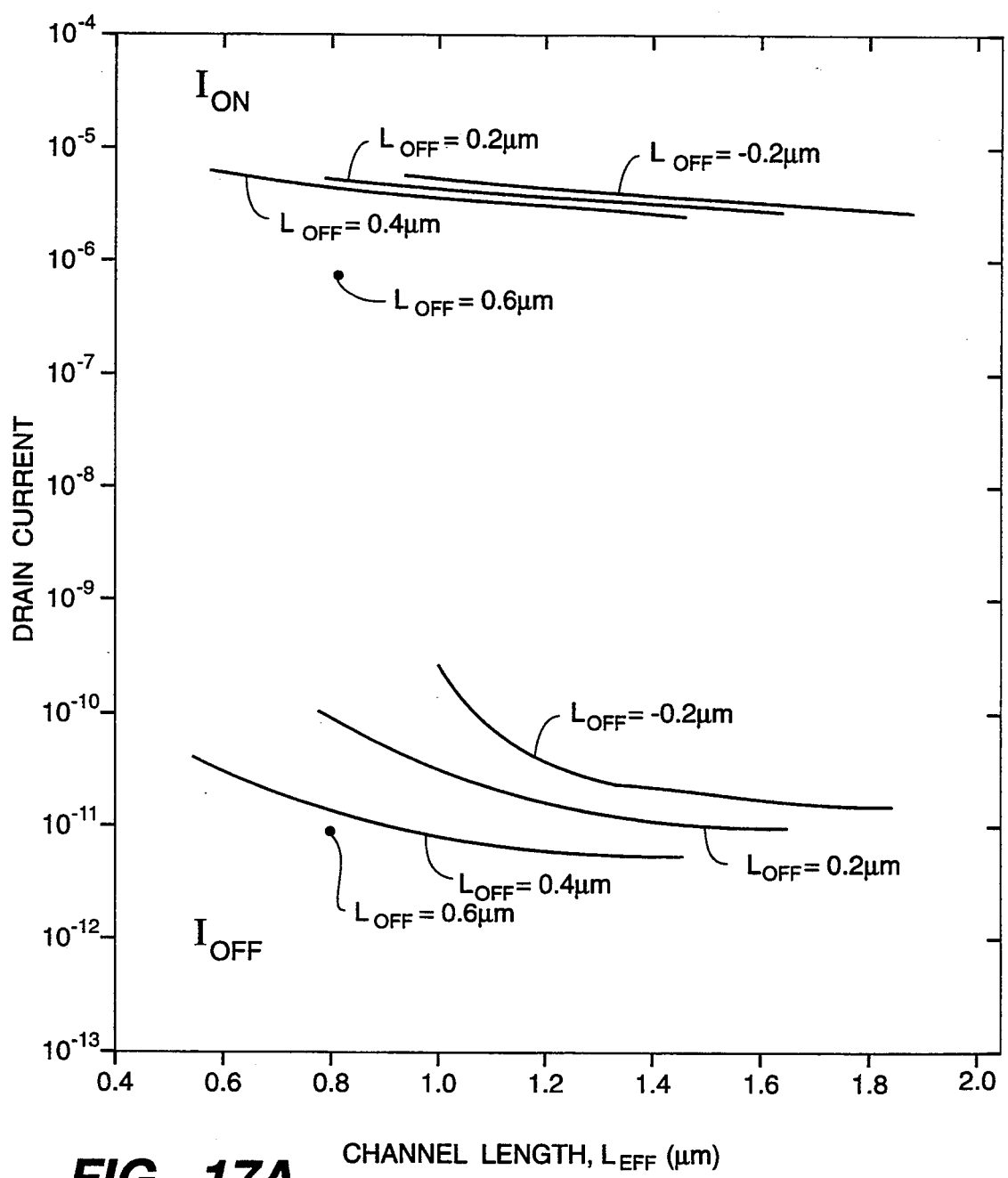
FIG._17A
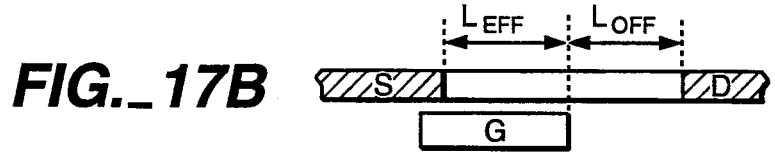
FIG._17B

INTEGRATED MEMORY CIRCUIT WITH HIGH DENSITY LOAD ELEMENTS

BACKGROUND OF THE INVENTION

This is a continuation-in-part of patent application Ser. No. 7/410,936, filed Sep. 22, 1989 now U.S. Pat. No. 5,107,322. This invention relates generally to integrated circuits utilizing TFTs and more particularly to the extension of resistance value of loads utilized in 4T/2R and 6T memory cell configurations, such as, utilized for memory cells in SRAM devices.

FIG. 1 illustrates the standard memory cell configuration utilizing a two load, cross-coupled inverters comprising driver or pulldown transistors $Q_1$ and $Q_2$ and two transfer or pass-gate transistors $Q_3$ and $Q_4$. The inverter circuits include load elements, L, connect to a source supply, $V_{DD}$. Node A connects one load element $L_1$, the drain of one driver transistor, $Q_1$, the drain of one transfer transistor, $Q_4$, and the gate of the other driver transistor, $Q_2$. Node B connects another load element, $L_2$, the drain of one driver transistor, $Q_2$, the drain of one transfer transistor, $Q_3$, and the gate of the other driver transistor, $Q_1$. Nodes A and B are the storage nodes of the memory cell which are to achieve and maintain stable logic values during standby and cell readout under reliable operation.

The reliability of these memory cells is directly related to the bistable stability of the memory cell wherein one node is always at a high logic level and the other node is corresponding at low logic level due to the use of cross-coupled driver transistor gates. Also, the cell stability depends on how well the driver transistors can hold their logic level, particularly their ability to hold a low logic state below the threshold operation of the transistor in order to insure that when one driver transistor is at a low logic state, it maintains its state with good assurance that the other driver transistor will be maintained in its OFF state. Instability will exist if, for example, due to leakage current of a driver transistor $Q_1$ or $Q_2$ exceeds the current supplying capability of load element, L, so that a node having a high logic value will be easily degraded, and the state of the cell will undesirably be change. Thus, efforts are undertaken to improve the functionality of the load elements, L, by reducing their leakage current level through increase of their load capacity. However, it happens that in order to accomplish that, it is necessary to utilize more silicon area so that it is necessary to increase the overall size of the cell to accommodate higher load capacity. This is definitely not desirable when the goal is to decrease memory cell size toward achieving higher memory density, better performance and lower manufacturing cost.

It is an objective of this invention to achieve lower leakage or drain current in the load elements, L, without requiring increases in silicon area required for formation of these elements in a memory cell. Exemplification of this invention relative to load elements, L, will include both 4T/2R cell configurations utilizing resistance loads and 6T cell configuration utilizing TFT load devices. First, however, a discussion concerning these different types of cell configurations as background is in order.

It is known in the art to provide integrated wiring interconnections in the fabrication of integrated circuits, such as, for example in the case of high resistance load type SRAMs. One such example is disclosed in Japanese Patent Laid Open No. 130461/1982 and is exemplified in FIGS. 2 and 3. In order to fully appreciate the present invention, it is first desirable to discuss the state of the art relative to wiring interconnects in conventional high resistance polycrystalline silicon load type memory cells in order to better understand and appreciate the improvements brought about by this invention.

FIG. 3 illustrates a schematic representation of a conventional 4T/2R, high resistance polycrystalline silicon load type memory cell comprising a flip flop for storing information with an output of one of two inverters, comprising series connected MOSFET $Q_1$ and a load element in the form of resistance $R_1$ and series connected MOSFET $Q_2$ and a load element in the form of resistance $R_2$, with each inverter connected as an input to the other. These flip flop circuits are combined with two switching or transfer MOSFETs $Q_3$ and $Q_4$ connected to the write line (WL) for exchanging information externally of the cell via data lines DL and $\overline{DL}$. Resistances $R_1$ and $R_2$ function to reduce the amount of current through the driver MOSFETs during ON conditions as well as control the amount of leakage current during standby or OFF conditions. The control of current is related to the doping level and length size possible for resistances $R_1$ and $R_2$.

FIG. 2 illustrates a cross sectional portion of the integrated circuit structure for the storage FF circuit schematic shown in FIG. 3. The structure comprises a p-type silicon substrate upon which are formed regions of field insulating film 2, e.g., $SiO_2$, beneath which are formed p-type channel stopper domains 3 to prevent the formation of parasitic channels. A gate insulating film 4, for example $SiO_2$, is provided on the surface of each active element domain comprising $Q_1$ through $Q_4$, which domains are surrounded by field insulating film 2. Active domains shown in the FIG. 2 cross section disclose only MOSFETs $Q_1$ and $Q_3$.

A word line of predetermined form comprises a double layer film of polycrystalline silicon film 5 and high temperature or fusing point metal silicide or polycide film 6, which form gate electrode 7 and the gate for MOSFET $Q_3$ bounded by side walls 11. These films are directly deposited on gate insulating film 4 and field insulating film 2. An n+-type source domain 9 and n+-type drain domain 10 are formed relative to each active element comprising a MOSFET, and are surrounded by field insulating film 2, and are in alignment with a word line, WL, gate electrode 7 and grounding conductor SL.

An interlayer insulating film 12, for example $SiO_2$, is deposited over the double layer films 5, 6 and MOSFETs $Q_1$ and $Q_3$. A first contact hole 16 is then formed in interlayer insulating film 12 and thereafter a wiring layer 15 comprising a polycrystalline silicon film of predetermined form is deposited thereon. Wiring layer 15 includes n+-type polycrystalline regions 15A and 15B and high resistance polycrystalline silicon resistances $R_1$, $R_2$ wherein, as seen in FIG. 2, only $R_2$ is visible. Region $R_1$ or $R_2$ comprise an intrinsic polycrystalline silicon film 15C, which is integral with regions 15A and 15B of n+-type polycrystalline film and all together form wiring layer 15. Next, a second interlayer insulating film 17, for example, a PSG film, is formed on wiring layer 15 followed by the deposition of data lines DL and $\overline{DL}$ (only line DL is visible in FIG. 3). Data lines DL and $\overline{DL}$ are connected respectively to drain domains 10 of MOSFETs $Q_3$ and $Q_4$ via the formed contact hole 21, as shown relative to $Q_3$ in FIG. 3. Resistance $R_1$, $R_2$ may be formed as follows. Wiring layer 15 is first deposited as a undoped or intrinsic polycrystalline silicon film over the surface of interlayer insulating film 12. Next, a portion of the deposited intrinsic polycrystalline silicon film to function as a high resistance polycrystalline silicon resistance is covered by a masking layer and the remaining portions of layer 15 are exposed to a diffusion process with an impurity, such as, phosphorous (P) or arsenic (As) and ion implantation or other type of incorporation method. The masking layer is then removed, producing a polycrystalline silicon film 15 having a pattern of predetermined form comprising wiring or conductor sections 15A and 15B of n+ polycrystalline Si film, enhanced in conductivity by introduction of phosphorous or arsenic, and high resistance, intrinsic polycrystalline silicon regions 15C forming resistance $R_1$ and $R_2$.

Under present practice, the sizes of the polycrystalline silicon resistances $R_1$ and $R_2$ are determined by the spatial relation between contact hole 16 and power source $V_{DD}$ at the other end of wiring layer 15. Thus, as best illustrated in FIG. 2, resistances $R_1$, $R_2$ are connected to the source domains of MOSFETs $Q_1$ through $Q_4$ via wiring layer 15. The other ends of resistances $R_1$, $R_2$ are connected to power source $V_{DD}$. The drains of MOSFETs $Q_1$ and $Q_2$ are connected to ground. Word line, WL, is connected to the gate electrodes of MOSFETs $Q_3$ and $Q_4$ and data lines DL and $\overline{DL}$ are connected to the drains of MOSFETs $Q_3$ and $Q_4$ via contact hole 21.

There remains, however, a problem in connection with the above described memory cell structure in that a refined construction and reduction in integrated circuit scale is not realizable. This problem is exemplified in the disclosure of Yoshio Sakai, "CMOS-SRAM Process Device Art", 28th Semiconductor Special Course Draft, pp. 69–114, wherein it is explained that, as the size of resistances $R_1$ and $R_2$ are shortened to refine the scale of the transistor structure, their resistance values become rapidly reduced, as illustrated in the diagram of FIG. 4. Therefore, a desired high resistance value is difficult to obtain or retain since resistance values will be naturally reduced in value with any reduction in the integrated circuit scale. As a result, in the particular case of a memory cell, such as, a SRAM, the leakage current during standby will be accordingly increase. Therefore, a certain reasonable size, currently about 3 microns or more, is necessary, which is a big obstacle toward the realization of a refined memory cell construction and a reduction in memory cell scale. Further, it is presently believed that, in the future, the size of such a memory cell will be governed by the required sizes of the resistance $R_1$ and $R_2$ and, as a result, this problem of scale will become even more intensified.

FIG. 5 illustrates a schematic representation of a conventional 6T, transistor load type memory cell comprising a flip flop circuit for storing information comprising series connected MOSFET $Q_1$ and a load element in the form of TFT $Q_6$, and series connected MOSFET $Q_2$ and a load element in the form of TFT $Q_5$, forming inverters connected as an input to each other. These inverter circuits are combined with two switching or transfer MOSFETs $Q_3$ and $Q_4$ connected to the write line (WL) for exchanging information externally of the cell via data lines DL and $\overline{DL}$. In general, the load elements comprising TFTs $Q_5$ and $Q_6$ are n-channel insulated gate field effect transistors and MOSFETs $Q_1$ and $Q_2$ are n-channel insulated gate field effect transistors. The gates of MOSFET $Q_2$ and TFT $Q_5$ are commonly connected to the drain of MOSFET $Q_4$, and the gates of MOSFET $Q_1$ and TFT $Q_6$ are commonly connected to the drain of MOSFET $Q_3$. The drain of MOSFETs $Q_1$ and $Q_2$ are connected to digit lines DL and $\overline{DL}$ via transfer MOSFETs $Q_3$ and $Q_4$. The gates of transfer MOSFETs $Q_3$ and $Q_4$ are connected to word line, WL. The sources of TFTs $Q_5$ and $Q_6$ are connected to power supply, $V_{DD}$, and the sources of MOSFETs $Q_1$ and $Q_2$ are connected to ground or reference potential.

Again, TFTs $Q_5$ and $Q_6$ function to reduce the amount of current through the driver MOSFETs during ON current conditions as well as control the amount of leakage current during standby or OFF conditions (gate voltage equal zero). The control of current is related to the channel length of the TFTs $Q_5$ and $Q_6$. However, compared to load elements comprising resistances $R_1$ and $R_2$, TFTs $Q_5$ and $Q_6$, as load elements, increase the current in ON current conditions, i.e., the ON current. As the size of a memory cell array becomes larger, such as in the case of a 4 Meg SRAM, the margin of drain and leakage current will become larger with the use of resistances $R_1$ and $R_2$ as load elements compared to the use of TFTs $Q_5$ and $Q_6$ as load elements. Thus, as the size of memories increases, the use of TFTs $Q_5$ and $Q_6$ as load elements becomes more desirable because of increased reliability, less power consumption and reduced standby current.

It is an object of the present invention to lower power consumption of integrated memory circuits with high density load elements.

It is another object of this invention to reduce the leakage or drain current, i.e., current consumption, in load elements of memory cells forming an integrated circuit memory array.

It is a further object of this invention to increase the resistance level in load elements comprising either active or passive electrical components in memory cells forming an integrated circuit memory array without increasing the memory cell size or, to the contrary, permitting further reduction in integrated circuit scale.

It is still a further object of this invention to increase the resistance level in load elements comprising either active or passive electrical components in memory cells forming an integrated circuit memory array by extending the length of the load element by taking into consideration the full dimensional size of the memory cell while reducing its scale to achieve greater compact density.

SUMMARY OF THE INVENTION

According to this invention, an integrated circuit with high density load elements in IC cells, such as, an array of memory cells, comprises load elements either of the active (TFTs) or passive (resistances) type and are designed so that the connection path between these load elements and the circuit active element domains formed in the integrated circuit substrate is extended within the same scale or is extended while reducing the scale of the individual memory cell configuration. For this purpose, the connection path may be extended through two or more conductive layers in an offset manner to provide for greater connection path length, i.e., extend in a first direction and then another direction within a single memory cell configuration. This arrangement also provides for the creation of additional space for extending the resistance value of the active or passive load element which, in turn, permits a reduction in current consumption of the load elements during operational conditions of the memory cells. While a reduction in drain current per transistor may not appear significant, it is of significant value when the combined number of such transistors is taken into consideration for the entire memory array. This has particular significance where memory cell arrays are of increasing capacity, such as, 4 Meg and 16 Meg, with concurrent integrated circuit scale reduction, as any decrease in power consumption becomes critical to performance and operation of the memory array.

Further, the extended connection path lengths within the same or smaller memory cell configuration creates a longer path for impurities from lower conductive layers to migrate before reaching the region of the load element and affecting or otherwise reducing its resistance value.

The extended path length interconnect means of this invention is particularly suited for application in an integrated circuit of a memory cell in a high resistance load type static RAM or SRAM, in which case the active or passive electrical component in the extended path length comprises a TFT or resistance having an enhanced resistance level due to the designed lateral extension of the wiring interconnect within the confines of the memory cell.

According to one aspect of this invention, interconnect means is provided to extend resistance levels or values for integrated passive elements, such as, resistances $R_1$ and $R_2$ in a SRAM explained above, while also maintaining or reducing the desired integrated circuit scale. This means is achieved by employing multiple conductor layers which are electrically connected and designed to permit an extension of the integrated and patterned resistance region while retaining or further reducing the original integrated circuit scale.

In particular, wiring or conductor interconnect means comprising this invention extends the value of an integrated passive electrical component coupled to other active electrical elements in an integrated circuit, the extended value provided without any change in or allowing for a reduction in the scale of integration among the passive or active electrical elements. The interconnect means comprises at least two conductive layers separated by insulating layers and laterally extended relative to the electrical elements to a permissible extremity wherein the conductor layers are electrically coupled through a contact hole in the insulating layer. Thus, a tiered formation of these layers is provided with adjacent tiers thereof being coupled at one elongated extremity thereof still within the confines of the individual memory cell. This configuration provides at least one extended wiring length, which is provided to include the desired integrated passive electrical component, whereby the magnitude of the integrated passive electrical component is extended because of the extended conductor length.

Advantages obtainable through the employment of this aspect of the invention are:
1. Resistances, or other such passive elements capable of being selectively deposited, diffused or implanted or the like, can be formed in integrated fashion in circuit conductor interconnects between active element domains, for example, in a memory cell configuration, which are extended and, therefore, higher resistance values can be realized without increasing memory cell size. This accomplished by shifting the contact hole relative to the circuit wiring layers so that the longitudinal extent of the resistance element can be enlarged. Thus, the integrated circuit area of a memory cell can be minimized and an enhancement of integration density may be accordingly achieved without any sacrifice of required resistance value.
2. Since a wiring layer capacity will correspondingly be increased by the method of manufacturing of this invention, the static RAM semiconductor device will be strengthened against the so called alpha ray soft error wherein alpha rays penetrate the semiconductor substrate causing undesirable potential fluctuations in the semiconductor device.
3. A satisfactory high resistance value can be readily and easily obtained without unconventional or complex processing techniques.
4. A SRAM semiconductor device will be stable with less consumption current, particularly during the time of standby operation.

According to another aspect of this invention, interconnect means is provided to extend resistance levels or values for integrated active elements, such as, extending the channel lengths and/or channel offsets of TFTs comprising the load elements, while also maintaining or reducing the desired integrated circuit scale. An increase in channel length, $L_{EFF}$, of a load TFT can be optimized to effectively reduce drain current for both transistor ON and OFF conditions of the active load element. Further, optimized increase lengths of channel offset, $L_{OFF}$, will also effectively reduce drain current for both transistor ON and OFF conditions. Lastly, optimized combinations of increase lengths of both channel lengths, $L_{EFF}$, and offset lengths, $L_{OFF}$, will provide for effective uniform reductions of drain current for both transistor ON and OFF conditions.

In the case of active load elements, the electrical connection path between source/drain domains is extended and, in doing so, the planar extent of the channel region for the load element TFTs can also be extended. As a result, the channel lengths and/or their offset lengths can be extended to optimize their effectiveness in reducing current consumption during OFF or standby current and ON current operations of the device. Also, by extending the path length to the channel and offset regions, a longer path is created for migration of impurities from lower conductive layers before they reach, for example, a lightly doped channel or offset region. For example, if the top conductive layer of the devices has a $p^+$ polysilicon channel region, there is a tendency for $n^+$ impurities to migrate into this region. With the $p^+$ channel region made sufficiently long, the migration of impurities will be unable to travel a sufficient distance into the $p^+$ region so as to reach the desired channel and offset region where they would detrimentally affect the operation of the resistance and effectively increase its operational current consumption.

Thus, the production of load elements with predetermined resistance levels can be assured to remain with such values during and with the completion of integrated circuit processing resulting in optimized yields and higher performance memory devices.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a schematic circuit diagram of a conventional memory cell that includes load elements as current limiting devices.

FIG. 2 is a sectional view showing an integrated circuit structure of a portion of a conventional high resistance polycrystalline silicon semiconductor load type memory cell.

FIG. 3 is a schematic circuit diagram of a specific type of conventional memory cell of the 4T/2R configuration comprising a high resistance polycrystalline silicon load type memory cell shown in part in FIG. 2.

FIG. 4 is a graphic illustration of the relation between measured high resistance polycrystalline silicon resistance sizes in microns and corresponding resistance values in ohms.

FIG. 5 is a schematic circuit diagram of a specific type of conventional memory cell of the 4T/2R configuration comprising a MOSFET load type memory cell.

FIG. 6A is a schematic plan view of an integrated circuit pattern of a semiconductor device comprising one embodiment of this invention.

FIG. 6B is a cross sectional view taken along the line 6B—6B of FIG. 6A relative to one embodiment of this invention.

FIG. 6C is a cross sectional view taken along the line 6B—6B of FIG. 6A relative to another embodiment of this invention.

FIGS. 7A, 7B and 7C are cross sectional views of the semiconductor device comprising this invention illustrating in a sequential manner a method of manufacture for the device shown in FIGS. 6A and 6B.

FIGS. 8A and 8B are schematic plan views of an integrated circuit pattern of a semiconductor device comprising another embodiment of this invention.

FIG. 9 is a cross sectional view taken along the line 9—9 of FIGS. 8A and 8B.

FIG. 10 is a cross sectional view taken along the line 10—10 of FIGS. 8A and 8B.

FIG. 10A is identical to FIG. 10 except that a dual gate structure for transistor $Q_5$ is included.

FIGS. 11A and FIG. 11B are schematic plan views of an integrated circuit pattern of a semiconductor device comprising a further embodiment of this invention.

FIG. 12 is a cross sectional view taken along the line 12—12 of FIGS. 11A and FIG. 11B.

FIG. 13 is a graphic illustration of the leakage current characteristics versus channel length when gate voltage is zero for a TFT of the type disclosed in FIGS. 8–13.

FIG. 14A is graphic illustration of the drain current, $I_{DS}$, versus gate voltage characteristics for respective TFTs having respective channel lengths of 1.2 μm and 1.8 μm.

FIG. 14B is a cross sectional view of the gate and channel structure relative to the data set forth in FIG. 14A.

FIG. 15A is graphic illustration of the drain current, $I_{DS}$, versus gate voltage characteristics for respective TFTs having respective channel lengths plus channel offset lengths, $L_{OFF}$, of 1.2 μm and 1.8 μm.

FIG. 15B is a cross sectional view of the gate and channel structure relative to the data set forth in FIG. 15A.

FIG. 16 is graphic illustration of the drain current, $I_{DS}$, versus gate voltage characteristics for respective TFTs having the same channel lengths but different respective channel offset lengths, $L_{OFF}$, of 0.4 μm and 0.6 μm.

FIG. 17A is graphic illustration of the drain current, $I_{DS}$, versus gate voltage characteristics for respective TFTs in connection with $I_{ON}$ and $I_{OFF}$ conditions for combination different channel lengths, $L_{EFF}$, and different channel offset lengths, $L_{OFF}$, of 0.4 μm and 0.6 μm.

FIG. 17B is a cross sectional view of the gate and channel structure relative to the data set forth in FIG. 17A.

DESCRIPTION OF THE PREFERRED EMBODIMENTS

FIG. 6A is a plan view of a static RAM memory cell comprising an embodiment of this invention and FIG. 6B is a sectional view thereof. As shown in FIG. 6B, a field insulating film 2 is deposited on the surface of semiconductor substrate 1. Elements making up the circuit are electrically isolated by field insulating film 2. A p-type channel stopper domain 3 is provided beneath film 2.

A gate insulating film 4 is provided on the surface of each active element domain surrounded by field insulating film 2. A word line, WL, of predetermined form comprises a double layer film of polysilicon film 5 and silicide or polycide film 6 (which form gate electrodes 7, 8) and grounding conductor, SL, (source domain 9), which electrode films are deposited on gate insulating film 4, field insulating film 2 and a portion of formed source domain 9. Grounding conductor, SL, comprises a diffusion layer formed in substrate 1. The $n^+$-type source domain 9 and $n^+$-type drain domain 10 are previously formed in each active element region surrounded by field insulating film 2 in alignment with word line, WL, gate electrodes 7, 8 and grounding conductor, SL. Switching MOSFETs $Q_3$, $Q_4$ comprise word line, WL, source domain 9 and drain domain 10; MOSFET $Q_1$ comprises gate electrode 7, drain domain 10 and source domain 9; and MOSFET $Q_2$ comprises gate electrode 8, source domain 9 and drain domain 10. Drain domain 10 of MOSFET $Q_1$ and source domain 9 of MOSFET $Q_4$ are common. MOSFETs $Q_1$ through $Q_4$ also contain a LDD (Lightly Doped Drain) structure. Source domain 9 and drain domain 10 are formed by introducing impurities in semiconductor substrate 1 in two separate stages for forming side wall 11 comprising, for example $SiO_2$, on the side of word line, WL, and gate electrodes 7, 8.

An interlayer insulating film 12 is provided over MOSFETs $Q_1$ and $Q_2$. A first contact hole 16 is formed in interlayer insulating film 12 and then a first wiring layer 13 comprising $n^+$-type polycrystalline silicon film of predetermined form, illustrated in FIG. 6B, is formed on film 12. Next, a second interlayer insulating film 14 is formed over the first interlayer insulating film 12 over MOSFETs $Q_1$ and $Q_2$. A second contact hole 18 is then formed in the second interlayer insulating film 14 over which is provided a second wiring layer 15 consisting of $n^+$-type polycrystalline silicon regions 15A and 15B of a predetermined form and high resistance polycrystalline silicon region 15C. First wiring layer 13 and second wiring layer 15 are electrically connected through second contact hole 18. Accordingly, second wiring layer 15 is connected to source domain 9 of MOSFETs $Q_3$ and $Q_4$ via second contact hole 18 provided in second insulating film 14 and adjacent the end of double film 5, 6 comprising electrode 7.

The sheet resistance for n+-type polycrystalline silicon regions and 15B will be, for example, about 150 ohms per square or smaller for a second wiring layer 15 having a thickness of about 100 nm.

Under present practice, relative sizes of the high resistance polycrystalline silicon resistances $R_1$, $R_2$ of regions 15C are determined according to the interval spacing between the first contact hole 16 and power source $V_{DD}$ as exemplified in FIG. 2. However, in the present invention, high resistance polycrystalline silicon resistances $R_1$, $R_2$ are formed through first wiring layer 13 to an extended second wiring layer 15, as illustrated in FIG. 6B, thereby determining the extent and, therefore, the value of resistances $R_1$, $R_2$ according to an interval spacing between the position of second contact hole 18 and power source $V_{DD}$. Accordingly, the relative sizes of resistances $R_1$, $R_2$ can be increased by the additional interval spacing between first contact hole 16 and second contact hole 18 without increasing the length or size of the memory cell, i.e., without increasing the length between MOSFETs $Q_1$ and $Q_3$, while achieving a required high resistance value for both resistances $R_1$, $R_2$. The increase in resistance value without change to the memory cell configuration is of significant importance in the light of the requirement for a refined construction which is realized by the approach of this invention. This approach leads to a decrease in current consumption of the static RAM during its standby mode. Also, since the area of the memory cell can be minimized while retaining large resistance values for $R_1$ and $R_2$, an increase in integration density of the memory chip is therefore possible.

A third interlayer insulating film 17, for example a PSG film, is then deposited over second wiring layer 15 and resistances $R_1$, $R_2$. Then, data lines DL and bar DL, each comprising an aluminum film, are deposited on interlayer insulating film 17. These data lines DL and bar DL are then connected respectively to drain domains 10 of MOSFET $Q_3$ and MOSFET $Q_4$ via contact holes 21 provided in gate insulating film 4, interlayer insulating film 12, second interlayer insulating film 14, and third interlayer insulating film 17.

Reference is now made to FIG. 6C comprising another embodiment of this invention. The FIG. 6C embodiment is substantially identical to the FIG. 6B embodiment and, therefore, like reference numerals denote the same components in each embodiment and the description for FIG. 6B is equally applicable to FIG. 6C. In FIG. 6C, however, first contact hole 16 is extended through insulating layer 12 so that the subsequent deposit of first wiring layer 13 is extended past the ends of electrode layers 5, 6 to be in direct surface contact with source domain 9, as indicated at 13A. In this manner, metal layer 13 is in direct contact with a surface portion of layer 6 as well as edges of both layers 5, 6, as indicated at 7A, in addition to direct contact at 13A with source domain 9. In the FIG. 6B embodiment, metal layer 13 is in direct contact with the surface of layer 6 and makes electrical contact to source domain 9 through electrode layers 5, 6.

A significant aspect of the structures shown in FIGS. 6B and 6C is three fold. First, from the connection at source drain 9, the second conductive layer 13 extends to the left of domain 9 to contact 15A which is in electrical communication with third conductive layer 15, which extends to the right, the opposite direction relative to second layer 13. Third conductive layer 15 includes resistance segment, $R_2$, at 15C. Since the memory cell includes all of MOSFET $Q_3$, including drain domain 10, the extension of a conductive interconnect to the end of the cell and thence through a contact hole to an upper conductive layer 15, substantially at the memory cell edge, permits an increase in the length of resistance segment 15C, taking into account the full extent of the memory cell for this purpose rather than a portion thereof, as is the case in FIG. 2. A greater length in the resistance segment 15 means an increase in resistance and a corresponding decrease in leakage current for the memory cell resulting in lower power consumption during standby and ON current operations.

Second, during fabrication of the memory device, impurities diffused into source domain 9 will partially diffuse out into and along second conductive layer 13. Prior art structures contain at least portions of the resistance segments in a comparable conductive layer and/or contact region comparable to contact 15A in FIG. 6B. The diffusion of impurities only reduces the resistance value of the resistance segment already established in such a conductive layer. However, by making the path longer between the source of impurity diffusion and the point at which contamination of such impurities will affect the resistance value by increasing the path length within the confines of the memory cell, without increasing the size of the memory cell, the possibility of contamination becomes remote and is considered nonexistent.

Further, by placing the resistance in third conductive layer 15 spaced slightly away from the region of contact 15A, impurities diffused from domain 9 into second layer 13 or from the second layer itself will not reach resistance segment 15C to contaminate its resistance value, as migrating impurities will not have ability to migrate through and around the edge of contact hole 15A due to the extended path length. In other words, because the path connection length has been made longer and the length of layer 15 has been made so much longer, the migrating impurities are unable to contaminate the effective resistance region 15C. As a result, there is a high degree assurance that there will be no reduction of the resistance value of resistance segment 15C during completion of fabrication of the memory device and corresponding effect on ultimate leakage current. Thus, one can count on the fact that the established increase in the resistance load element 15C in third conductive layer 15 will not be contaminated by subsequent processing and migration of impurities reducing its established resistance value.

Third, the provision of the resistance segment 15C in a single layer provides for accuracy in forming the resistance value, which is naturally deteriorated due to lack of mask accuracy as compared to many cases in the prior art where the resistance load element is formed in two separate conductive layers. Also, with all of the resistance load elements provided in a single layout, these resistance regions throughout the memory array can be achieved in a single step process.

Reference is now made to a fabrication process for the static RAM disclosed in FIGS. 6A and 6B. After MOSFETs $Q_1$ through $Q_4$, word line, WL, grounding conductor, SL, and other components have been formed, as illustrated in FIG. 7A, insulating film 12 is deposited over the foregoing after which first contact hole 16 is formed in film 12 by photoetching. Then, polycrystalline silicon film 19 is formed over the surface, for example, to a thickness of 100 nm or so, via chemical vapor deposition. Next, an impurity, such as P, As or the like, is diffused into film 19 followed by an ion implantation to achieve a low resistance in the film. In the case of ion implantation of a P impurity, for example, an ion implant of about 30 keV with a dose rate at about $6\times 10^{15}$ cm$^{-2}$ is suitable.

Next, as illustrated in FIG. 7B, polycrystalline silicon film 19 is patterned in a predetermined form through selective photoetching. The patterning is in the direction of word line, WL, (FIG. 6A) from first contact hole 16. Next, second interlayer insulating film 14 is formed over the surface and second contact hole 18 is formed through film 14 by photoetching. Second contact hole 18 is formed, not over first contact hole 16, but laterally in the direction of word line, WL, and laterally beyond the position of hole 16 so that the length and, therefore, correspondingly the resistance values of $R_1$ and $R_2$ can be increased.

Next, as shown in FIG. 7C, an intrinsic polycrystalline silicon film of relative thin dimension, for example about 50 nm or so, is formed on second interlayer insulating film 14 via chemical vapor deposition. Next, a resist mask layer is provided on a portion 15C of the intrinsic polycrystalline silicon film 14, which will correspond to resistances $R_1$, $R_2$ to be subsequently formed. This is followed with a diffusion of P or As and ion implantation in the exposed regions 15A and 15B thereby maintaining portion 15C of film 14, protected by the resist mask layer, at it's existing high resistance value while those portions 15A and 15B exposed to the diffusion and ion implant process are at a low resistance value. Since film 14 is thinner than first wiring layer 13, it is desirable that energy employed for ion implantation of the impurity be of lower value than employed in connection with the treatment of film 19.

After the resist mask layer is removed, polycrystalline silicon layers 20 (FIG. 6A) are patterned into desired form via photoetching resulting in a wiring or conductor layer 15 of predefined dimensions and including conductive regions 15A and 15B and high resistance regions 15C, comprising $R_1$ and $R_2$, with $R_2$ being visible in FIG. 7C. Third interlayer insulating film 17, contact hole 21 and data lines DL and $\overline{DL}$ are thereafter formed, as depicted in FIGS. 6A and 6B, to complete the fabrication of the static RAM.

Thus, according to the manufacturing process described above, a static RAM with minimized standby or leakage current, $I_{DDS}$, and stable operating characteristics is achieved through a fairly simple fabrication process.

The concept of this invention is not limited to passive components in the form of resistances in a SRAM circuit but also is extendible to other passive components capable of being deposited, such as capacitors and inductors, as well as extendible to other types of IC applications. Also, a high fusing point metallic silicide film may be provided for first wiring layer 13, instead of a polycrystalline silicon film, to provide for the low resistance value portions of the film. In this case, a sheet resistance value of first wiring layer 13 may be decreased to approximately 15 ohms per square or below. As a result, a memory signal delay due to excessive wiring resistance may be prevented or substantially reduced. Since the resistance value is low, the use of this silicide film may also be employed as a wiring layer relative to input/output circuits on an IC chip.

Furthermore, if the high resistance polycrystalline silicon resistances $R_1$, $R_2$ are formed in second wiring layer 15, for example, so as to cross over an end of first wiring layer 13, their crossing will naturally occur at different levels in the circuit. Therefore, the sizes of $R_1$ and $R_2$ may be substantially increased due to the length of increase provided in the intrinsic polycrystalline film deposited between wiring levels 13 and 15. As a result, the resistance values for $R_1$ and $R_2$ may be further increased without any change in the memory cell scale.

Lastly, if first wiring layer 13 or a portion thereof is constructed of an intrinsic silicon film along with all or a portion of second wiring layer 15, then two high resistances connected in series may be realized thereby providing means for obtaining very high resistance levels or values in the IC structure. With respect to the forgoing, it can, therefore, be appreciated that these resistance values may be varied by adding series resistances either laterally in horizontal layers or regions of a semiconductor device or in vertical layers or regions transversely of the deposited layers of the semiconductor device. Also, it can be realized that a serpentine pattern of series resistances included in longitudinally extended conductors separated by insulating layers with conductor ends in adjacent conductors coupled via contact opening in the insulating layer therebetween, which opening is prepared at one extremity of such adjacent conductors.

The previous embodiments have dealt with memory cells wherein the load elements in the cells are passive elements in the form of resistances formed in the memory cell structure. However, active elements, such as, TFTs $Q_5$ and $Q_6$ of the type shown in FIG. 5, may be utilized as load elements and may be constructed in a manner to analogously achieve benefits also achieved in previously described embodiments, i.e., formation of TFT or MOSFET channel lengths or combination channel lengths and channel offsets in a single layer wherein higher, optimized resistance levels in channel operation are achieved with greater channel lengths and/or channel offsets resulting in lower drain current, i.e., less current consumption. In other words, if the channel length is made longer in the n-channel load elements, the drain current during ON conditions will be smaller and the standby or leakage current, $I_{DDS}$, will also be significantly smaller. Increases in the resistance levels with longer and optimized channel lengths and/or channel offsets provides for lower memory cell power consumption. Also, lengthened paths to the optimized channels and their associated offsets can protect them from the influence of migration of impurities affecting the desired resistance level or properties of the channel.

Reference is now made to FIGS. 8–10 with reference to a further embodiment of this invention utilizing active elements as load elements in a memory cell configuration. In this case, instead of resistances as a load device, TFTs $Q_5$ and $Q_6$ are utilized as load elements. Generally, as the size of SRAM configurations become larger, the power consumption correspondingly increases. Thin film transistors as load devices involve less power consumption than resistances as load devices and, therefore, are more preferable in larger SRAM configurations, such as, 4 Meg or 16 Meg configurations.

As shown in FIGS. 9 and 10, a field insulating film 32 is deposited on the surface of semiconductor substrate 30, e.g., p-type silicon, for conventional electrical element isolation. Insulating film 34 is provided also on the surface of substrate 30 as a gate insulating film for MOSFETs $Q_1$–$Q_3$. Source domains 36, e.g., n+, for MOS- FETs $Q_3$ and $Q_4$ are formed in substrate 30 in a conventional manner and a portion of the gate insulating film 34 is removed as shown in FIGS. 9 and 10.

Four conductive layers doped, for example, doped $n^+$, are provided in the structure, and first conductive layer 38 of $n^+$ polycrystalline silicon is formed to provide, in part, a gate structure for MOSFETs $Q_1$–$Q_4$. In this connection, first conductive layer 38 is also in contact with source domains 36 of MOSFETs $Q_3$ and $Q_4$. Openings 41 are formed in film 38 to partition the film for the separate gate structures for $Q_1$, $Q_3$, and for $Q_2$, $Q_4$. This is followed by the formation of side walls 39 of $SiO_2$ for the gate structures and the formation of oxide layer 40.

Next, a selective etch is performed through oxide film 40, as shown at 41 in FIGS. 9 and 10. Then, oxide film 40 is selectively etched to form openings 43 to layer 38. Next, second conductive layer 44 of $n^+$ polycrystalline silicon is selectively formed as shown in FIGS. 9 and 10. Selective portions of formed layer 44, e.g., regions 44A, function as a shield against interference from the electrical fields established by the vertically aligned transistors, e.g., $Q_2$ and $Q_6$, so that these active elements do not electrically interfere with one another. The formation of second conductive layer 44 is followed by the formation of another oxide layer 42 to insulate layer 44 from subsequently deposited conductive layers.

A selective etch is then performed in conjunction with layers 40 and 42 shown in FIG. 9 to form contact openings 45. Then, third conductive layer 46 of $n^+$ polycrystalline silicon is selectively formed comprising the gate structures for TFTs $Q_5$ and $Q_6$ as well as to form a conductive interconnect between first conductive layer 38 and last to be formed, fourth conductive layer 50, as shown in FIG. 9.

With the completion of the selective formation of third conductive layer 46, a thin oxide film 48 is deposited as shown in FIGS. 9 and 10 which functions as thin film gate oxide for the gates of TFTs $Q_5$ and $Q_6$. Oxide layer 48 is then selectively terminated (FIG. 9) at 48A or is selectively etched (FIG. 10) at 47 followed by the formation of fourth conductive layer 50 of $p^+$ polycrystalline silicon and diffusion of n-channel regions 54 and $n^-$ offset regions 56 in layer 50 above gate regions 44A. Thus, a contact is established between third and fourth conductive layers 44 and 50. Furthermore, as best seen in FIG. 9, oxide film 48 is formed to extend to a region above source domain 36, i.e., film 48 extends in a horizontal direction to within or beyond vertical alignment with impurity domains 36.

An important aspect of the structure shown in FIGS. 9 and 10 is that the path or distance between source domains 36 and the formed channel and offset regions 54 and 56 is extended or made longer by the conductive path being formed through first conductive layer 38, thence third conductive layer 44 to fourth conductive layer 50, thence around the end portion 48A of thin oxide film 48 along layer 50 to offset region 56.

Thus, as in the case of previous embodiments employing passive load elements, a three fold advantage is achieved. First, from source domains 36, the conductive path extends first upwardly in the structure somewhat to the right of source domains 36 and thence to the left via fourth conductive layer 50 thereby permitting additional length in layer 50 for an increase in the length of channel 54 and/or its offset 56, taking into account the full extent of the memory cell for the purpose of increasing the path length to formed regions 54, 56 of the TFT. This permits an extension in the possible length of the load element, i.e., the channel length and/or offset of the TFT, to provide for a reduction in drain current operation resulting in lower current consumption resulting in overall reduced power consumption.

Secondly, this extension in path length also permits consideration of an extension in the amount of undesirable contamination due to migrating impurities into the channel and offset region. By extending the length of layer 50, a longer path for impurity migration is created sufficiently long so as to render them unable to the reach the channel and/or offset region 54, 56 where they would be detrimental to the operation of the transistor and effectively reduce the designed value of the channel and/or offset.

Third, mask alignment accuracy is better achieved in extended planar extent of formed fourth conductive layer 50 to thereby more precisely form the predetermined lengths for either or both the channel 54 and offset 56.

FIG. 10A is the same as FIG. 10 except that transistor $Q_5$ includes a dual gate structure. Another thin oxide layer 48' is formed on fourth conductive layer 50 followed by the formation of a second gate region 44B on the surface of oxide layer 48'. Thus, channel 54 includes a gate region both below (gate 44A) and above (gate 44B) the channel.

Reference is now made to FIGS. 11A, 11B and 12 illustrating another embodiment of this invention. This embodiment is similar to the immediately previous embodiment except that the extend path between diffused domains and the channels and offsets of the active load elements, TFTs $Q_5$ and $Q_6$, is made longer in view of the design.

As shown in FIG. 12, a field insulating film 62 is deposited on the surface of semiconductor substrate 60, e.g., p-type silicon, for conventional electrical element isolation. Insulating film 64 is provided also on the surface of substrate 60 as a gate insulating film for MOSFETs $Q_1$–$Q_3$. Source domains 66, e.g., $n^+$, for MOSFETs $Q_3$ and $Q_4$ are formed in substrate 60 in a conventional manner, followed by the formation of diffusion domains 66 and 67 and the removal of a portion of the gate insulating film 64 as shown in FIG. 12.

Four conductive layers doped, for example, $n^+$, are provided in the structure, and first conductive layer 68 of $n^+$ polycrystalline silicon is formed for a gate structure for MOSFETs $Q_1$–$Q_4$. In this connection, layer 68 is also in contact with source domains 66 of MOSFETs $Q_3$ and $Q_4$. Openings 71 are formed in film 68 to partition the film for the separate gate structures for $Q_1$, $Q_3$, and for $Q_2$, $Q_4$. This is followed by the formation of side walls 69 of $SiO_2$ for the gate structures and the formation of oxide layer 70.

Next, a selective etch is performed through oxide film 70, as shown at 73 in FIG. 12, to expose a contact region with first conductive layer 68. Next, second conductive layer 74 of $n^+$ polycrystalline silicon is selectively formed as shown in FIG. 12. Second conductive layer 74 functions as an extended path length between first conductive layer 68 and subsequently to-be-formed third conductive layer 76. Next, oxide layer 72 is formed over second conductive layer 74 followed by selective etching to form contact openings 77. Next, third conductive layer 76 is formed and is masked so that selective portions of formed layer 76, e.g., regions 76A, function as a gate electrode for MOSFET $Q_4$ and TFT $Q_6$. This is followed by the formation of another oxide layer 78 to insulate third conductive layer 76 from subsequently deposited conductive layer 80.

A selective etch is then performed at 79 to expose third conductive layer 76 through overlying oxide film 78 followed by the formation of fourth conductive layer 80 of p+ polycrystalline silicon and diffusion of n⁻ channel regions 84 and n⁻ offset regions 86 in layer 80 above gate regions 76A. Thus, a contact is established between second, third and fourth conductive layers 74, 76 and 80. Furthermore, as best seen in FIG. 12, oxide film 72 extends well beyond a region above source domains 66, i.e., film 72 extends in a horizontal direction well beyond its substantial vertical alignment with channels 84 and offsets 86 in layer 80.

An important aspect of this embodiment, as in the case of the previous embodiment, is that the conductive path between domains 66 and channel offset 86 has been extended by constructing the path therebetween to extend, first, to the right in FIG. 12, in proximity to the edge of the memory cell, and thence through layer 74, upward through layer 76 and thence layer 80 and to extend, second, to the left in FIG. 12 through layer 80 to offset 86 and channel 84 taking into account the full extent of the memory cell for the purpose of increasing the path length to formed regions 84, 86 of the TFT. This permits an extension in the possible length of the load element, i.e., the channel length and/or offset of the TFT, to provide for a reduction in drain current operation resulting in lower current consumption resulting in overall reduced power consumption.

Secondly, this extension in path length also permits consideration of an extension in the amount of undesirable contamination due to migrating impurities into the channel and offset region. By extending the length of layer 80, a longer path for impurity migration is created sufficiently long so as to render them unable to the reach the channel and/or offset region 84, 86 where they would be detrimental to the operation of the transistor and effectively reduce the designed value of the channel and/or offset.

Third, accuracy in mask alignment accuracy is better achieved in extended planar extent of formed fourth conductive layer 80 to thereby more precisely form the predetermined lengths required for either or both the channel 84 and offset 86.

The concept of extending the length of the conductive path between impurity domains and TFT channel regions within the same memory cell configuration permits an increase in the TFT channel length. As illustrated digramatically in the graph of FIG. 13, increases in channel length is generally known to reduce the leakage current, $I_{DDS}$, through the TFT channel during OFF or standby condition (gate voltage equal to zero). Thus, an overall reduction power consumption is realized in a large array of memory cells, which can be quite significant in larger SRAM configurations. However, the problem is the application of this concept to these new memory configurations and, in particular, how to increase channel lengths in a manner to obtain optimized benefits in lower current consumption and lower power consumption while maintaining or reducing memory cell size.

FIGS. 14A, 14B illustrate the effect of an increase in channel length of load elements, such as, TFTs $Q_5$ and $Q_6$. FIG. 14A shows the property of drain current, $I_{DS}$, versus gate voltage for the structure illustrated in FIG. 14B. In the particular example shown, channel lengths of 1.2 μm and 1.8 μm are illustrated. As illustrated in FIG. 14B, there is a margin of error due to mask alignment accuracies of approximately 0.2 μm. To be noted is that at or near zero volts (OFF current) to −5 volts (ON current) of applied gate voltage, there is reduction in drain current, $I_{DS}$, for a longer channel length of 1.8 μm compared to a shorter channel length of 1.2 mm. Thus, there is a reduced current consumption and flow during both OFF and ON current conditions for the extended TFT channel structure. While the amount shown in FIG. 14A does not appear to be a significant difference in current reduction, it should be realized that this reduction is highly significant when applied to TFT load transistors in a large SRAM memory cell configuration, such as, 4 Meg or 16 Meg SRAM.

FIGS. 15A, 15B illustrate the effects of an increase both in channel length and in channel offset of load elements, such as, TFTs $Q_5$ and $Q_6$. FIG. 15A shows the property drain current, $I_{DS}$, versus gate voltage for the structure illustrated in FIG. 15B. In the particular example shown, respective channel lengths 1.2 μm and 1.8 μm plus an offset length, $L_{OFF}$, of 0.4 μm are utilized. As illustrated in FIG. 15B, there is a margin of error due to mask alignment accuracies of approximately 0.2 μm. As in the case of FIG. 14, at or near zero volts (OFF current) to −5 volts (ON current) of applied gate voltage, there is reduction in drain current, $I_{DS}$, for a longer channel length of 1.8 μm compared to a shorter channel length of 1.2 mm. Thus, there is a reduced current consumption and flow during both OFF and ON current conditions for the extended TFT channel/offset structure. While the amount of drain current reduction shown does not appear to be a significant, it is highly significant when applied relative to all of the TFT load transistors utilized in a large SRAM memory cell configuration.

FIG. 16 illustrates the effect of an increase in channel offset of load elements, such as, TFTs $Q_5$ and $Q_6$, with the channel length maintained at 1.2 μm. In FIG. 16, the property of drain current, $I_{DS}$, versus gate voltage is shown for two different channel offsets, $L_{OFF}$, of 0.4 μm and 0.6 μm. As seen from FIG. 16, the effect of an increase in offset also reduces current consumption during both OFF and ON conditions of the TFTs in operation of the memory cell.

FIG. 17A illustrates the effect of an increase in channel and offset lengths relative to one another and with respect to both ON and OFF current conditions. In FIG. 17A, the property of drain current, $I_{DS}$, for ON current conditions and OFF current conditions versus channel length, $L_{EFF}$, is shown for different channel offsets, $L_{OFF}$, ranging from no offset ($L_{OFF}= -0.2$ μm) to $L_{OFF}=0.6$ μm. FIG. 17B illustrates the channel/offset structure for the data illustrated in FIG. 17A. To be noted is that current consumption is reduced with increase in channel offset but that effective reduction of current consumption is maximized and remains as such with increasing channel length/offset for channel offsets up to about $L_{OFF}=0.4$ μm for both $I_{ON}$ and $I_{OFF}$. When the channel offset, $L_{OFF}$, is increased to 0.6 μm, the effect is no longer continuous but is optimum at a channel length, $L_{EFF}$, of about 0.8 μm. Thus, a combination channel length of about 0.8 μm and an offset of 0.6 μm provides a combined optimum low drain current, $I_{DS}$. However, for OFF or standby conditions, a offset length of 0.4 μm is substantially of the same optimum value for a range of channel lengths, e.g., in the range of 1.0 μm to 1.4 μm.

The channel length of the TFTs may be in the range of 0.6 μm to 1.8 μm and the length of their channel offset may be in the range of zero to 0.8 μm.

While the invention has been described in conjunction with several specific embodiments, it is evident to those skilled in the art that many further alternatives, modifications and variations will be apparent in light of the forgoing description. For example, this invention is not limited to memory cells but may be utilized in other integrated circuits wherein it is beneficial to reduce consumption current. One other example are integrated circuits used in liquid crystal displays. Further, this invention has been principally described relative to active and passive load elements in memory circuits but may be also applied to other such elements in an integrated circuit, such as, other transistor configuration in the same integrated circuit as well as transistor structures in five-layer polysilicon integrated circuits utilizing two gates in spatially separated polysilicon layers between which is another polysilicon layer utilized as a channel region. Lastly, conductivity types of transistors and channels can be reversed. Thus, the invention described herein is intended to embrace all such alternatives, modifications, applications and variations as fall within the spirit and scope of the appended claims.

What is claimed is:

1. An integrated circuit comprising a plurality of circuit cells each having load elements and transistors formed relative to a semiconductor substrate, said transistors having source/drain domains with some of said domains electrically connected through a plurality of conductive and insulating layers formed on said substrate to said load elements comprising a load connection path, said load connection path relative to each of said cells comprising an insulating layer formed on said substrate, a first conductive layer formed on said insulating layer and electrically connected at a first region to at least one of said domains, said first conductive layer extending laterally away from said first region in a first direction to a second region in proximity to an edge of said circuit cell laterally spaced from said first region, a second conductive layer spatially insulated from and substantially parallel with said first conductive layer and connected to said first conductive layer at an interconnect formed at said second region between said first and second conductive layers, said second conductive layer having a planar extent extending substantially across said cell in a second direction opposite to said first direction, each of said load elements formed in said second conductive layer in a region along said planar extent spaced in said second direction from said interconnect so that said load elements are shielded from contamination by impurity migration from said one domain along said first conductive layer, said planar extent of said second conductive layer increased due to the extension of said first conductive layer to said cell edge permitting an extended length of said load elements to include a correspondingly extended resistance level reducing operational current consumption of said cell while increasing the length of said load connection path to make allowance for said impurity migration, each of said load elements comprises a TFT having a TFT channel formed in said second conductive layer having an extended length and resistance value due, in part, to said extended length to said load connection path.

2. The integrated circuit of claim 1 wherein said TFT includes a gate formed both below and above said TFT channel.

3. The integrated circuit of claim 1 wherein said TFT channel comprises a n⁻ region.

4. An integrated circuit comprising a plurality of circuit cells each having load elements and transistors formed relative to a semiconductor substrate, said transistors having source/drain domains with some of said domains electrically connected through a plurality of conductive and insulating layers formed on said substrate to said load elements comprising a load connection path, said load connection path relative to each of said cells comprising an insulating layer formed on said substrate, a first conductive layer formed on said insulating layer and electrically connected at a first region to at least one of said domains, said first conductive layer extending laterally away from said first region in a first direction to a second region in proximity to an edge of said circuit cell laterally spaced from said first region, a second conductive layer spatially insulated from and substantially parallel with said first conductive layer and connected to said first conductive layer at an interconnect formed at said second region between said first and second conductive layers, said second conductive layer having a planar extent extending substantially across said cell in a second direction opposite to said first direction, each of said load elements formed in said second conductive layer in a region along said planar extent spaced in said second direction from said interconnect so that said load elements are shielded from contamination by impurity migration from said one domain along said first conductive layer, said planar extent of said second conductive layer increased due to the extension of said first conductive layer to said cell edge permitting an extended length of said load elements to include a correspondingly extended resistance level reducing operational current consumption of said cell while increasing the length of said load connection path to make allowance for said impurity migration, each of said load elements comprise a resistance formed in said second conductive layer having an extended length and resistance value due, in part, to said extended length to said load connection path.

5. The integrated circuit of claim 4 wherein said resistance comprises a p+ region.

6. An integrated circuit comprising a plurality of circuit cells each having load elements and transistors formed relative to a semiconductor substrate, said transistors having source/drain domains with some of said domains electrically connected through a plurality of conductive and insulating layers formed on said substrate to said load elements comprising a load connection path, said load connection path relative to each of said cells comprising an insulating layer formed on said substrate, a first conductive layer formed on said insulating layer and electrically connected at a first region to at least one of said domains, said first conductive layer extending laterally away from said first region in a first direction to a second region in proximity to an edge of said circuit cell laterally spaced from said first region, a second conductive layer spatially insulated from and substantially parallel with said first conductive layer and connected to said first conductive layer at an interconnect formed at said second region between said first and second conductive layers, said second conductive layer having a planar extent extending substantially across said cell in a second direction opposite to said first direction, each of said load elements formed in said second conductive layer in a region along said planar extent spaced in said second direction from said interconnect so that said load elements are shielded from contamination by impurity migration from said one domain along said first conductive layer, said planar extent of said second conductive layer increased due to the extension of said first conductive layer to said cell edge permitting an extended length of said load elements to include a correspondingly extended resistance level reducing operational current consumption of said cell while increasing the length of said load connection path to make allowance for said impurity migration, said each of said circuit cells comprises a memory cell in a TFT load type static RAM, each of said load elements comprising a TFT channel having an extended length and resistance value due, in part, to said extended length to said load connection path.

7. An integrated memory circuit comprising a plurality of circuit cells each having load elements and MOSFETs formed relative to a semiconductor substrate, said MOSFETs having source/drain domains formed in said substrate with some of said domains electrically connected through a plurality of conductive and insulating layers formed on said substrate to said load elements comprising a load connection path, said load connection path relative to each of said memory cells comprising an insulating layer formed on said substrate, a first conductive layer formed on said insulating layer and electrically connected at a first region to at least one of said domains, said first conductive layer extending laterally away from said first region in a first direction to a second region in proximity to an edge of said memory cell laterally spaced from said first region, a second conductive layer spatially insulated from and substantially parallel with said first conductive layer and connected to said first conductive layer at an interconnect formed at said second region between said first and second conductive layers, said second conductive layer having a planar extent extending substantially across said memory cell in a second direction opposite to said first direction, each of said load elements formed in said second conductive layer in a region along said planar extent and extending in said second direction from said interconnect so that said load elements are not present in said second region of said interconnect, said planar extent of said second conductive layer increased due to the extension of said first conductive layer to said cell edge permitting an extended length of said load elements to include a correspondingly extended resistance level while reducing current consumption of said memory cell while increasing the length of said load connection path, each of said circuit cells comprises a memory cell in a TFT load type static RAM, each of said load elements comprising a TFT channel having an extended length and resistance value due, in part, to said extended length to said load connection path.

8. The integrated memory circuit of claim 7 wherein said TFT channel has a length in the range of 0.6 μm to 1.8 μm.

9. An integrated memory circuit comprising a plurality of circuit cells each having load elements and MOSFETs formed relative to a semiconductor substrate, said MOSFETs having source/drain domains formed in said substrate with some of said domains electrically connected through a plurality of conductive and insulating layers formed on said substrate to said load elements comprising a load connection path, said load connection path relative to each of said memory cells comprising an insulating layer formed on said substrate, a first conductive layer formed on said insulating layer and electrically connected at a first region to at least one of said domains, said first conductive layer extending laterally away from said first region in a first direction to a second region in proximity to an edge of said memory cell laterally spaced from said first region, a second conductive layer spatially insulated from and substantially parallel with said first conductive layer and connected to said first conductive layer at an interconnect formed at said second region between said first and second conductive layers, said second conductive layer having a planar extent extending substantially across said memory cell in a second direction opposite to said first direction, each of said load elements formed in said second conductive layer in a region along said planar extent and extending in said second direction from said interconnect so that said load elements are not present in said second region of said interconnect, said planar extent of said second conductive layer increased due to the extension of said first conductive layer to said cell edge permitting an extended length of said load elements to include a correspondingly extended resistance level while reducing current consumption of said memory cell while increasing the length of said load connection path, each of said circuit cells comprises a memory cell in a TFT load type static RAM, each of said load elements comprising a TFT channel offset having an extended length and resistance value due, in part, to said extended length to said load connection path.

10. The integrated memory circuit of claim 9 wherein said TFT channel offset has a length in the range of zero to 0.8 μm.

11. An integrated memory circuit comprising a plurality of circuit cells each having load elements and MOSFETs formed relative to a semiconductor substrate, said MOSFETs having source/drain domains formed in said substrate with some of said domains electrically connected through a plurality of conductive and insulating layers formed on said substrate to said load elements comprising a load connection path, said load connection path relative to each of said memory cells comprising an insulating layer formed on said substrate, a first conductive layer formed on said insulating layer and electrically connected at a first region to at least one of said domains, said first conductive layer extending laterally away from said first region in a first direction to a second region in proximity to an edge of said memory cell laterally spaced from said first region, a second conductive layer spatially insulated from and substantially parallel with said first conductive layer and connected to said first conductive layer at an interconnect formed at said second region between said first and second conductive layers, said second conductive layer having a planar extent extending substantially across said memory cell in a second direction opposite to said first direction, each of said load elements formed in said second conductive layer in a region along said planar extent and extending in said second direction from said interconnect so that said load elements are not present in said second region of said interconnect, said planar extent of said second conductive layer increased due to the extension of said first conductive layer to said cell edge permitting an extended length of said load elements to include a correspondingly extended resistance level while reducing current consumption of said memory cell while increasing the length of said load connection path, each of said circuit cells comprises a memory cell in a TFT load type static RAM, each of said load elements comprising a TFT channel and channel offset having an extended length and resistance value due, in part, to said extended length to said load connection path.

12. The integrated memory circuit of claim 11 wherein said TFT channel has a length in the range of 0.6 μm to 1.8 μm and said channel offset has a length in the range of zero to 0.8 μm.

13. An integrated memory circuit comprising a plurality of circuit cell configurations each having load elements and MOSFETs formed relative to a semiconductor substrate, said MOSFETs having source/drain domains formed in said substrate with some of said domains electrically connected through a plurality of conductive and insulating layers formed on said substrate to said load elements comprising a load connection path, said load connection path relative to each of said memory cells comprising a first insulating layer formed on said substrate, a first conductive layer formed on said first insulating layer and connected to at least one of said domains, said first conductive layer functioning, in part, as a gate electrode for at least one of said memory cell MOSFETs, a second insulating layer formed on said first conductive layer, a second conductive layer formed on said second insulating layer and connected to said first conductive layer in a first region in close proximity to said domain, said second conductive layer extending laterally way from said first region in a first direction to a second region in proximity to an edge of said memory cell, a third insulating layer formed on said second conductive layer, a third conductive layer formed on said third insulating layer and partitioned to form an interconnect at said second region and a gate electrode for at least one of said load elements, a fourth insulating layer formed on said third conductive layer, a fourth conductive layer formed on said fourth insulating layer and extending between said second region interconnect to said second layer and across said memory cell in a second direction opposite to said first direction, said planar extent of said fourth conductive layer increased due to the extension of said second conductive layer to said memory cell edge permitting an extended length of said load element to include a correspondingly extended resistance level while reducing current consumption of said memory cell while increasing the length of said load connection path.

14. The integrated memory circuit of claim 13 wherein each of said circuit cells comprises a memory cell in a TFT load type static RAM, each of said load elements comprising a TFT channel having an extended length and resistance value due, in part, to said extended length to said load connection path.

15. The integrated memory circuit of claim 14 wherein said TFT channel has a length in the range of 0.6 μm to 1.8 μm.

16. The integrated memory circuit of claim 13 wherein each of said circuit cells comprises a memory cell in a TFT load type static RAM, each of said load elements comprising a TFT channel offset having an extended length and resistance value due, in part, to said extended length to said load connection path.

17. The integrated memory circuit of claim 16 wherein said TFT channel offset has a length in the range of zero to 0.8 μm.

18. The integrated memory circuit of claim 13 wherein each of said circuit cells comprises a memory cell in a TFT load type static RAM, each of said load elements comprising a TFT channel and channel offset having an extended length and resistance value due, in part, to said extended length to said load connection path.

19. The integrated memory circuit of claim 18 wherein said TFT channel has a length in the range of 0.6 μm to 1.8 μm and said channel offset has a length in the range of zero to 0.8 μm.

20. An integrated circuit comprising a plurality of circuit cells each having load elements and transistors formed relative to a semiconductor substrate, said transistors having source/drain domains with some of said domains electrically connected through a plurality of conductive and insulating layers formed on said substrate to said load elements comprising a load connection path, said load connection path relative to each of said cells comprising an insulating layer formed on said substrate, a first conductive layer formed on said insulating layer and connected at a first region to at least one of said domains, said first conductive layer extending laterally away from said first region in a first direction to a second region in proximity to an edge of said circuit cell, a second conductive layer spatially insulated from and substantially parallel with said first conductive layer and connected to said first conductive layer at an interconnect formed at said second region between said first and second conductive layers, said second conductive layer having a planar extent extending substantially across said cell in a second direction opposite to said first direction, said planar extent of said second conductive layer increased due to the extension of said first conductive layer to said cell edge permitting an extended length of said load elements to include a correspondingly extended resistance level reducing operational current consumption of said cell while increasing the length of said load connection path to make allowance for impurity migration and prevention of contamination of said load element, said load elements comprising a TFT having a TFT channel and an adjacent channel offset formed in said second conductive layer having an extended length and resistance value due, in part, to said extended length to said load connection path.

21. The integrated memory circuit of claim 20 wherein said TFT channel has a length in the range of 0.6 μm to 1.8 μm and said channel offset has a length in the range of zero to 0.8 μm.

22. An integrated memory circuit comprising a plurality of circuit cells each having load elements and MOSFETs formed relative to a semiconductor substrate, said MOSFETs having source/drain domains formed in said substrate with some of said domains electrically connected through a plurality of conductive and insulating layers formed on said substrate to said load elements comprising a load connection path, said load connection path relative to each of said memory cells comprising an insulating layer formed on said substrate, a first conductive layer formed on said insulating layer and connected at a first region to at least one of said domains, said first conductive layer extending laterally away from said first region in a first direction to a second region in proximity to an edge of said memory cell, a second conductive layer spatially insulated from and substantially parallel with said first conductive layer and connected to said first conductive layer at an interconnect formed at said second region between said first and second conductive layers, said second conductive layer having a planar extent extending substantially across said memory cell in a second direction opposite to said first direction, said planar extent of said second conductive layer increased due to the extension of said first conductive layer to said memory cell edge permitting an extended length of said load elements to include a correspondingly extended resistance level while reducing current consumption of said memory cell while increasing the length of said load connection path, said circuit cells comprising a memory cell in a TFT load type static RAM, each of said load elements comprising a TFT channel and an adjacent channel offset having an extended length and resistance value due, in part, to said extended length to said load connection path.

23. The integrated memory circuit of claim 22 wherein said TFT channel has a length in the range of 0.6 $\mu$m to 1.8 $\mu$m and said channel offset has a length in the range of zero to 0.8 $\mu$m.

* * * * *